United States Patent
Berkey et al.

(10) Patent No.: US 6,319,634 B1
(45) Date of Patent: Nov. 20, 2001

(54) PROJECTION LITHOGRAPHY PHOTOMASKS AND METHODS OF MAKING

(75) Inventors: George Edward Berkey, Pine City; Lisa Anne Moore, Corning; Michelle Diane Pierson, Painted Post, all of NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 09/397,572

(22) Filed: Sep. 16, 1999

Related U.S. Application Data

(60) Provisional application No. 60/123,861, filed on Mar. 12, 1999.

(51) Int. Cl.[7] .............................. G03F 9/00; B32B 17/06; C03B 37/075
(52) U.S. Cl. ................... 430/5; 428/426; 65/397
(58) Field of Search ..................... 430/5; 378/35; 65/109, 3, 67, 102, 397; 359/355; 385/144; 356/35.5; 501/54, 53; 428/426

(56) References Cited

U.S. PATENT DOCUMENTS

| | | |
|---|---|---|
| 1,283,333 | 10/1918 | Shaw . |
| 2,188,121 | 1/1940 | Smith ..................... 47/78.1 |
| 3,740,207 | 6/1973 | Bogrets et al. ........... 65/67 |

(List continued on next page.)

FOREIGN PATENT DOCUMENTS

| | | | | |
|---|---|---|---|---|
| 2704015 A1 | 3/1978 | (DE) | .............. | C03B/23/04 |
| 0 735 006 | 10/1996 | (EP) | .............. | C03B/19/14 |
| 0 901 989 A1 | 3/1999 | (EP) | .............. | C03B/19/14 |
| 0 607 433 B1 | 11/1998 | (EP) | .............. | C03B/23/06 |
| 0 147 029 | 10/1984 | (EP) | .............. | C03B/37/016 |
| 0 163 752 | 12/1985 | (EP) | .............. | C03B/37/018 |
| 0 483 752 A2 | 5/1992 | (EP) | .............. | C03C/3/06 |
| 0 488 320 A1 | 6/1992 | (EP) | .............. | C03C/3/06 |
| 0 636 586 A1 | 2/1995 | (EP) | .............. | C03C/3/06 |
| 0 691 312 | 1/1996 | (EP) | .............. | C03C/3/06 |
| 0 870 737 A1 | 10/1998 | (EP) | .............. | C03C/3/06 |
| 0 401 845 A2 | 12/1990 | (EP) | .............. | G02B/1/00 |
| 257590 | 3/1927 | (GB) | . | |
| 2184434 | 6/1987 | (GB) | .............. | C03B/20/00 |
| 67/22389 | 11/1967 | (JP) | . | |
| 1-138145 | 5/1989 | (JP) | . | |
| 62-235223 | 10/1987 | (JP) | .............. | C03B/20/00 |
| 63-210044 | 8/1988 | (JP) | .............. | C03C/17/245 |
| 98/27018 | 6/1998 | (WO) | .............. | C03B/19/14 |
| 98/52879 | 11/1998 | (WO) | .............. | C03B/19/14 |
| 00/24684 | 5/2000 | (WO) | .............. | C03B/32/00 |

OTHER PUBLICATIONS

Encyclopedia Britannica Online Article, blow molding, (Aug. 30, 1999).

Encyclopedia Britannica Online Article, glassblowing (Aug. 30, 1999).

(List continued on next page.)

Primary Examiner—S. Rosasco
(74) Attorney, Agent, or Firm—Edward F. Murphy

(57) ABSTRACT

The present invention is a method of making a lithography photomask and photomask blank. The method of making the lithography photomask and photomask blank includes providing a silicon oxyfluoride glass tube having an OH content less than 50 ppm. The method further includes cutting the silicon oxyfluoride glass tube, flattening the silicon oxyfluoride glass tube, and forming the flattened cut silicon oxyfluoride glass tube into a photomask blank having a planar surface. The present invention includes a glass lithography mask preform. The glass lithography mask preform is a longitudinal silicon oxyfluoride glass tube that has an OH content $\leq$10 ppm, a F wt. % concentration $\geq$0.5 wt. %.

59 Claims, 25 Drawing Sheets

U.S. PATENT DOCUMENTS

| | | | |
|---|---|---|---|
| 3,933,454 | 1/1976 | DeLuca | 65/3 |
| 4,221,825 | 9/1980 | Guerder et al. | 427/34 |
| 4,345,928 | 8/1982 | Kawachi et al. | 65/18.2 |
| 4,363,647 | 12/1982 | Bachman et al. | 65/18.2 |
| 4,612,023 | 9/1986 | Kreutzer et al. | 65/32 |
| 4,650,511 | 3/1987 | Koya et al. | 65/30.1 |
| 4,666,495 | 5/1987 | Kreutzer et al. | 65/258 |
| 4,676,814 | 6/1987 | Ross et al. | 65/3.12 |
| 4,789,389 | 12/1988 | Schermerhorn et al. | 65/31.2 |
| 4,917,718 | 4/1990 | Berkey | 65/108 |
| 5,043,002 | 8/1991 | Dobbins et al. | 65/31.2 |
| 5,326,729 | 7/1994 | Yaba et al. | 501/54 |
| 5,364,433 | 11/1994 | Nishimura et al. | 65/17.4 |
| 5,410,428 | 4/1995 | Yamagata et al. | 359/350 |
| 5,415,953 | 5/1995 | Alpay et al. | 430/5 |
| 5,474,589 | 12/1995 | Ohga et al. | 65/397 |
| 5,599,371 | 2/1997 | Cain et al. | 65/413 |
| 5,609,666 | 3/1997 | Heitmann | 65/421 |
| 5,655,046 | 8/1997 | Todoroki et al. | 385/144 |
| 5,667,547 | 9/1997 | Christiansen et al. | 65/17.4 |
| 5,668,067 | 9/1997 | Araujo et al. | 501/54 |
| 5,679,125 | 10/1997 | Hiraiwa et al. | 65/397 |
| 5,683,483 | 11/1997 | Yosiaki et al. | 65/102 |
| 5,698,484 | 12/1997 | Maxon | 501/54 |
| 5,699,183 | 12/1997 | Hiraiwa et al. | 359/355 |
| 5,702,495 | 12/1997 | Hiraiwa et al. | 65/17.1 |
| 5,702,847 | 12/1997 | Tarumoto et al. | 430/5 |
| 5,707,908 | 1/1998 | Komine et al. | 501/53 |
| 5,735,921 | 4/1998 | Araujo et al. | 65/32.1 |
| 5,764,345 | 6/1998 | Fladd et al. | 356/35.5 |
| 5,837,024 | 11/1998 | Fabian | 65/17.4 |
| 5,935,733 | 8/1999 | Scott et al. | 430/5 |
| 5,970,746 | 10/1999 | Fujinoki et al. | 65/102 |
| 6,016,669 | 1/2000 | Correa et al. | 65/109 |
| 6,087,283 | 7/2000 | Jinbo et al. | 501/54 |

OTHER PUBLICATIONS

Encyclopedia Britannica Online Article, industrial glass (Aug. 30, 1999).

Encyclopedia Britannica Online Article, illustration (Aug. 30, 1999).

Graphite Die Mold, Product Literature, http://graphitediemold.com/product.html (Aug. 23, 1999).

Graphite Die Mold, Mission Statement, (Aug. 23, 1999).

Graphite Die Mold, New and Views, (Aug. 23, 1999).

Customerseric@e—composties.com Tool Making process, (Aug. 23, 1999) pp. 1–5.

Patent Abstracts of Japan, vol. 1996, No. 07, Jul. 31, 1996, JP 08067530, Sumitomo Electric Ind Ltd., Mar. 12, 1996, Abstract.

Patent Abstracts of Japan, vol. 012, No. 191 (C–501), Jun. 3, 1988, JP 62–297233, Fujitsu Ltd., Dec. 24, 1987, Abstract.

Patent Abstracts of Japan, vol. 006, No. 252 (P–161), Dec. 10, 1982, JP 57–147604, Nippon Denki KK, Sep. 11, 1982, Abstract.

Douglas Allan, Charlene Smith, N.F. Borrelli and T. P. Seward III, 193 nm excimer–laser–induced densification of fused silica, Optics Letters/vol. 21, No. 24/Dec. 15, 1996, pp. 1960–1962.

Roger J. Araujo, Nicholas F. Borrelli and Charlene Smith, Induced Absorption In Silica (A Prliminary Model), SPIE vol. 3424, 1998, pp. 25–32.

George H. Beall, Industrial Applications Of Silica, Reviews in Minerology, 29, pp. 469–505.

N.F. Borrelli, Charlene Smith, Douglas C. Allan and T.P. Seward III, Densification of fused silica under 193–nm excitation, J. Opt. Soc. Am B/vol. 14, No. Jul. 7, 1997, pp. 1606–1615.

J.W. Fleming and D.L. Wood, refractive index dispersion and related properties in fluorine doped silica, Applied Optica/vol. 22, No. 19/Oct. 1, 1983, pp.3102–3104.

David L. Griscom, *Optical Properties and Structure of Defects in Silica Glass*, The Centennial Memorial Issue, 99[10], 1991, pp. 926–942.

Hideo Hosono, Masafumi Mizuguchi, and Hiroshi Kawazoe, *Effects of fluorine dimer excimer laser radiaiotn on the optical transmission and defect formation of various types of synthetic $SiO_2$ glasses*, Applied Physics Letters, vol. 74, No. 19, May 10, 1999, pp. 2755–2757.

Toshio Ibuki et al., *Absorption Spectra Of $SiCl_4$, $SiCl_6$, $SiF_3CH_3$ And $GeF_4$ In The Vuv Region*, Chemical Physics Letters, vol. 136, No. 5, May 15, 1987, pp. 447–450.

W.D. Kingery, H.K. Brown, and D. R. Uhlmann, *Introduction to Ceramics, Second Edition*, John Wiley & Sons, 1976. pg. 654.

M. Kyoto, Y. Ohga, S. Ishikawa, Y. Ishiguro, *Research and Development Group, Sumitomo Electric Industries Ltd*, 1993 Chapman and Hall, pp. 2738–2744.

I. H. Malitosn, *Interspecimen Comparison of the Refractive Index of Fused Silica*, Journal of the Optical Society of America, vol. 55, No. 10, pp. 1205–1209.

James A. McClay and Angela S.L. McIntyre, *157 nm optical lithography: The accomplishments and the challenges*, Solid State Technology, Jun. 1999, pp. 57–68.

Taro Moritani et al., "*Glass Engineering Handbook*," Apr. 20, 1964, Asakura Shoten, p. 611, Clause 2.1 Fabrication.,.

M. Rothschild, D.J. Ehrlich & D.C. Shaver, *Effects Of Excimer Laser Irradiation On The Transmission, Index Of Refraction, And Density Of Ultraviolet Grade Fused Silica*, Appl. Phys. Lett 55(13) Sep. 25, 1999, pp. 1276–1278.

Charlene M. Smith, Lisa A. Moore, *Fused Silica for 157mn Transmittance*, SPIE vol. 3676, Mar. 15–17, 1999, pp. 834–841.

D.R. Sempolinski, T.P. Seward, C. Smith, N. Borrelli, C. Rosplock, *Effects of Glass Forming conditins on the KrF Excimer–Laser–Induced Optical Damage In Synthetic Fused Silica*, Journal of Non–Crystalline Solids 203 (1996) pp. 69–77.

Richard H. Stulen & donald W. Sweeney, *Extreme Ultraviolet Lithography*, Optics & Photonics News, Aug. 1999, vol. 10, No. 8, pp. 34–38.

Richard E. Schenker & William G. Oldham, *Ultraviolet–induced Densification In Fused Silica*, J. Appl. Phys. 82 (3), Aug. 1, 1997, pp. 1065–1071.

Koji Tsukuma, N. Yamada, S. Kondo, K. Honda & H. Segawa, *Refractive Index, Dispersion and Absorption of Fluorine–Doped Silica glass in the Deep UV Region*, Journal of Non–Crystalline Solids 127 (1991), pp. 191–196.

H. Takahashi, A. Oyobe, M. Kosuge & R. Setaka, *Characteristics of Fluorine–Doped Silica Glass*, Technical Digest: European Conference on Optical Communication, (1986) pp. 3–6.

K. Tsukama, N. Yamada, S. Kondo, K. Honda & H. Segawa, *Refractive Index, Dispersion and Absorption of Fluorine–Doped Silica Glass in the Deep UV Region*, Journal of Non–crystalline Solids 127 (1991), pp. 191–196.

W. Vogel, Chemistry of Glass, The American Ceramic Society, Inc. (1985), pp. 203–205.

PTO: 96–0383, Journal, Title: Sheet Glass.

Corning HPFS®, ArF Grade, Product Literature, 1999.

Shin–Etsu Chemical Homepage, Semiconductor Materials Division, http://www.shinetsu.co.jp/english/profile/division/sem–div/sem–div.html, (May 17, 1999), pp. 1–20.

Purity and Chemical Reactivity, Isimoto Co., Ltd. Homepage, Purity and Chemical Reactivity, http://www.isimoto.com/isimoto/english/feature1.html, (May 17, 1999) pp. 1–3.

Products for Optics, Isimoto Co., Ltd. Homepage, http://www.isimoto.com/isimoto/english/variation 3.html, (May 17, 1999) pp. 1–2.

Product Information, Isimoto Co., Ltd. Homepage, http://www.isimoto.com/isimoto/english/product info.html, (May 17, 1999) pp. 1–4.

High Purity Quartz Glass Products, http://www.toshiba–ceramics.com/quartz.html, (May 17, 1999) pp. 1–2.

Heraeus Quarzglas, Fused Silica for 157nm photomasks, Bruno Uebbing 157 nm workshop, Feb. 16, 1999 Phoenix/USA, pp. 1–5.

Heraeus, Product Literature, Quartz Glass for Optics Optical Properties, Edition 1994.

Heraeus Amersil, Product Literature, The Leader in Silica Glass & Fabricated Quartz Glass Semiconductor Products: CVD Tubes, (Sep. 14, 1999).

Heraeus Amersil, Product Literature, The Leader in Silica Glass & Fabricated Quartz Glass: Diffusion Tubes, (Sep. 14, 1999).

Heraeus Amersil, Product Literature, The Leader in Silica Glass & Fabricated Quartz Glass Semiconductor Products: Furnace Tubes, (Sep. 14, 1999).

Heraeus Amersil, Product Literature, The Leader in Silica Glass & Fabricated Quartz Glass Semiconductor Products: Windows, (Sep. 14, 1999).

Heraeus Amersil, Product Literature, The Leader in Silica Glass & Fabricated Quartz Glass Semiconductor Products: Optical Propertie, (Sep. 14, 1999).

Heraeus Amersil, Product Literature, The Leader In Silica Glass & Fabricated Quartz Glass Semiconductor Products: Thermal Properties, (Sep. 14, 1999).

Heraeus Amersil, Product Literature, The Leader In Silica Glass & Fabricated Quartz Glass Semimconductor Product: Raw Materials, (Sep. 14, 1999).

Heraeus Amersil, Product Literature, The Leader in Silica Glass & Fabricated Quartz Glass Semiconductor Products: Corporate Profile, (Sep. 14, 1999).

PROJECTION LITHOGRAPHY PHOTOMASKS AND METHODS OF MAKING

CROSS REFERENCE TO RELATED APPLICATION(S)

This application claims priority to U.S. Provisional Patent Application Ser. No. 60/123,861 filed on Mar. 12, 1999, the content of which is relied upon and incorporated herein by reference in its entirety and the benefit of priority under 35 U.S.C. § 120 is hereby claimed.

BACKGROUND OF THE INVENTION

1. Field of the Invention

The present invention relates generally to lithography photomasks, and particularly to optical photolithography mask blanks for use in optical photolithography systems utilizing vacuum ultraviolet light (VUV) wavelengths below 193 nm, preferably below 175 nm, preferably below 164 nm, such as VUV projection lithography systems utilizing wavelengths in the 157 nm region.

2. Technical Background

Projection optical photolithography systems that utilize the vacuum ultraviolet wavelengths of light below 193 nm provide benefits in terms of achieving smaller feature dimensions. Such systems that utilize vacuum ultraviolet wavelengths in the 157 nm wavelength region have the potential of improving integrated circuits with smaller feature sizes. Current optical lithography systems used by the semiconductor industry in the manufacture of integrated circuits have progressed towards shorter wavelengths of light, such as the popular 248 nm and 193 nm wavelengths, but the commercial use and adoption of vacuum ultraviolet wavelengths below 193 nm, such as 157 nm has been hindered by the transmission nature of such vacuum ultraviolet wavelengths in the 157 nm region through optical materials. Such slow progression by the semiconductor industry of the use of VUV light below 175 nm such as 157 nm light has been also due to the lack of economically manufacturable photomask blanks from optically transmissive materials. For the benefit of vacuum ultraviolet photolithography in the 157 nm region such as the emission spectrum VUV window of a $F_2$ excimer laser to be utilized in the manufacturing of integrated circuits there is a need for mask blanks that have beneficial optical properties including good transmission below 164 nm and at 157 nm and that can be manufactured economically.

Photomask blanks used in such lithography systems are different from the other optical elements of the system such as lenses and mirrors in that the photomasks are generally very thin and play a unique part in the system in terms of providing a substrate for integrated circuit patterns that are projected through the system. Patterns of the integrated circuits to be made are formed on the surface of photomask blanks, so that an image of the pattern on the photomask blank can be projected through the lithography system and printed on a surface of an integrated circuit semiconductor wafer. Photomask blanks must meet very strict requirements for dimensional stability to avoid warping and shrinking and for optical properties such as high transmission in order to ensure the extreme accuracy required to form very fine integrated circuit patterns and inhibit the distortion there of.

The present invention overcomes problems in the prior art and provides a means for economically manufacturing high quality improved photomask blanks that can be used to improve the manufacturing of integrated circuits with vacuum ultraviolet wavelengths.

SUMMARY OF THE INVENTION

Figure 1:
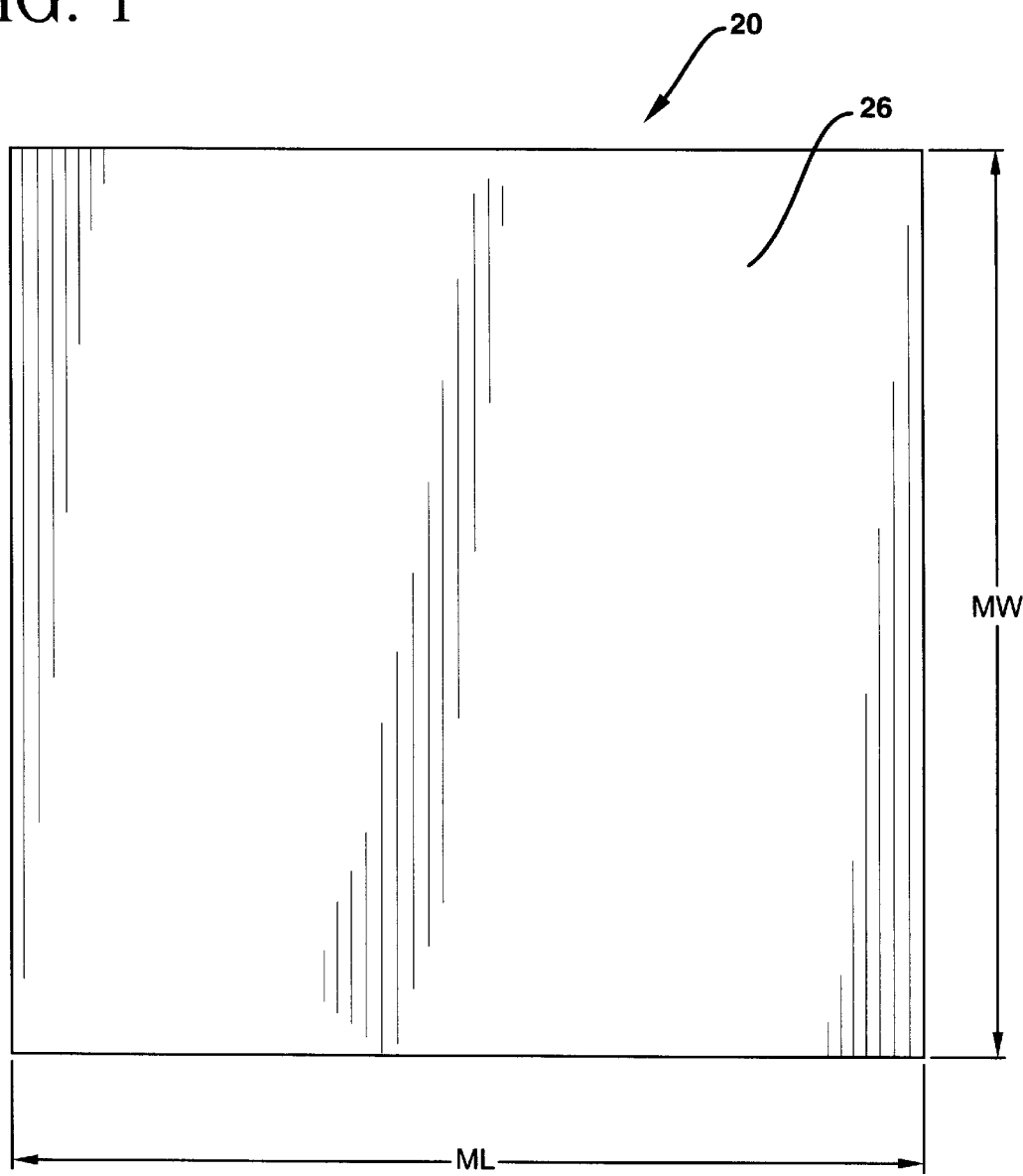
FIG. 1 is a top view of an embodiment of the invention.

One aspect of the present invention is a method of making a lithography photomask and photomask blank. The method of making the lithography photomask and photomask blank includes providing a silicon oxyfluoride glass tube having an OH content less than 50 ppm. The method further includes cutting the silicon oxyfluoride glass tube, flattening the silicon oxyfluoride glass tube, and forming the flattened cut silicon oxyfluoride glass tube into a photomask blank having a planar surface.

In another aspect, the present invention includes a glass lithography mask preform. The glass lithography mask preform is a longitudinal silicon oxyfluoride glass tube that has an OH content $\leq 10$ ppm, a F wt. % concentration $\geq 0.5$ wt. %. The longitudinal tube has a central axis along the longitudinal length wherein the glass tube includes concentric layers of striae centered about the central axis.

In a further aspect, the present invention includes a lithography photomask and photomask blank. The lithography photomask and photomask blank comprise a flat planar silicon oxyfluoride glass member having a top planar surface and a bottom planar surface. The silicon oxyfluoride glass has an OH content $\leq 10$ ppm and a F wt. % concentration $\geq 0.5$ wt. %. The silicon oxyfluoride glass has parallel layers of striae wherein the parallel layers of striae are parallel to the top surface.

In another aspect, the present invention includes a glass planar sheet flat glass lithography wafer preform for forming a lithography mask having a mask width MW, a mask length ML, and a mask thickness MT, with the glass lithography mask preform comprising a glass tube with an inside radius IR, a thickness T, a length L, and a longitudinal center tube axis CA, wherein the glass tube includes concentric layers of striae centered about the center axis CA, with $IR \geq 7/44$ MW, T>MT, and $L \geq ML$.

In a further aspect, the present invention includes a method of making a mask comprising the steps of: providing a glass tube mask preform having a thickness T, a length L, a longitudinal center tube axis CA, with the glass tube mask preform including concentric layers of striae centered about the center axis CA, forming the glass tube mask preform into a flat planar glass mask having a top planar surface and a bottom planar surface, wherein the flat planar glass mask has parallel layers of striae that are parallel to the top planar surface and the bottom planar surface.

In another aspect, the present invention includes a glass blank preform. The glass blank preform is comprised of a longitudinal glass tube having a longitudinal length, a polygonal cross sectional shape and a central axis along the longitudinal length and normal to the polygonal cross sectional shape with the glass tube having concentric layers of striae centered about the central axis.

In a further aspect, the present invention includes a method of making a glass blank. The method includes providing a glass tube, providing a mold, positioning the glass tube proximate the mold, heating the glass tube, applying a deforming fluid pressure to the heated glass tube so that the glass tube conforms to the mold, cooling the glass tube to provide a flat sided glass tube, and cutting a flat side from the flat sided glass tube.

In another aspect, the present invention includes a method of making a mask blank. The method includes providing a silicon oxyflouride glass tube, heating the glass tube, evacuating the interior of the headed glass tube to collapse the heated tube into an evacuated flattened glass tube, and forming the flattened glass tube into a photomask blank.

In another aspect, the present invention includes a glass blank preform for forming a blank having a blank width MW, a blank length ML and a blank thickness MT. The glass blank preform is comprised of a flat sided glass tube with a thickness T, a length L, a flat sided height H and a longitudinal center tube axis CA, wherein the glass tube has concentric layers of striae centered about the center axis CA, $H \geq MW$, $T \geq MT$, and $L \geq ML$.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principals and operation of the invention.

DETAILED DESCRIPTION OF THE PREFERRED EMBODIMENTS

Reference will now be made in detail to the present preferred embodiments of the invention, examples of which are illustrated in the accompanying drawings. An exemplary embodiment of a lithography photomask blank of the present invention is shown in FIG. 1 and is designated generally throughout by reference numeral 20.

Figure 3:
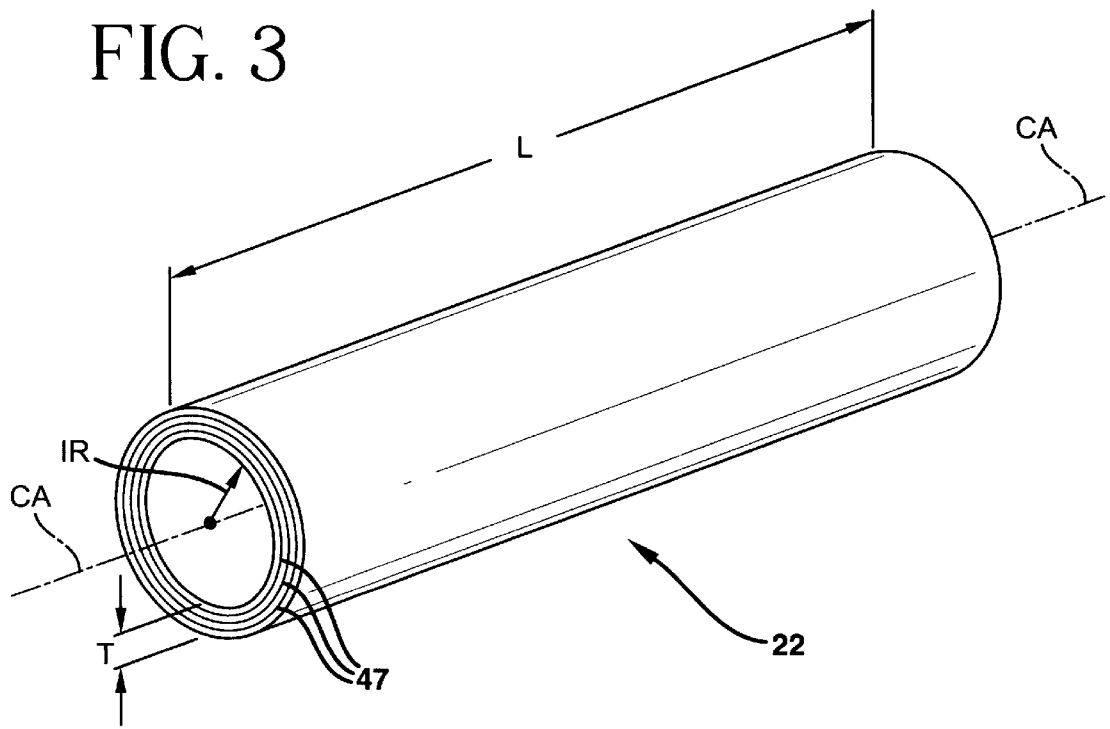
FIG. 3 is a perspective view of an embodiment of the invention.
Figure 4:
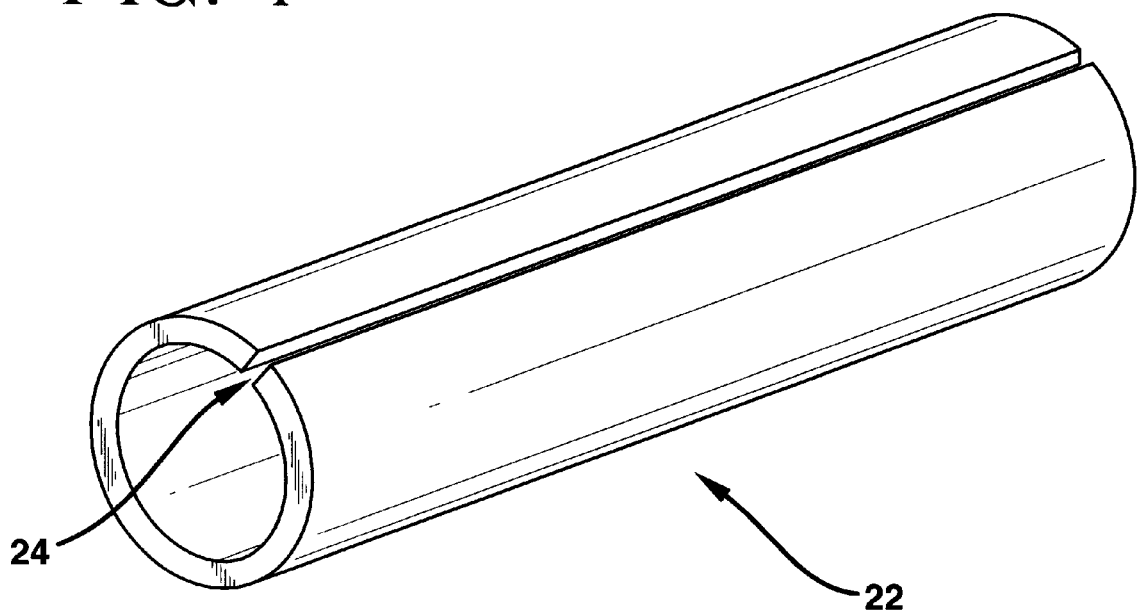
FIG. 4 is a perspective view of an embodiment of the invention.
Figure 5:
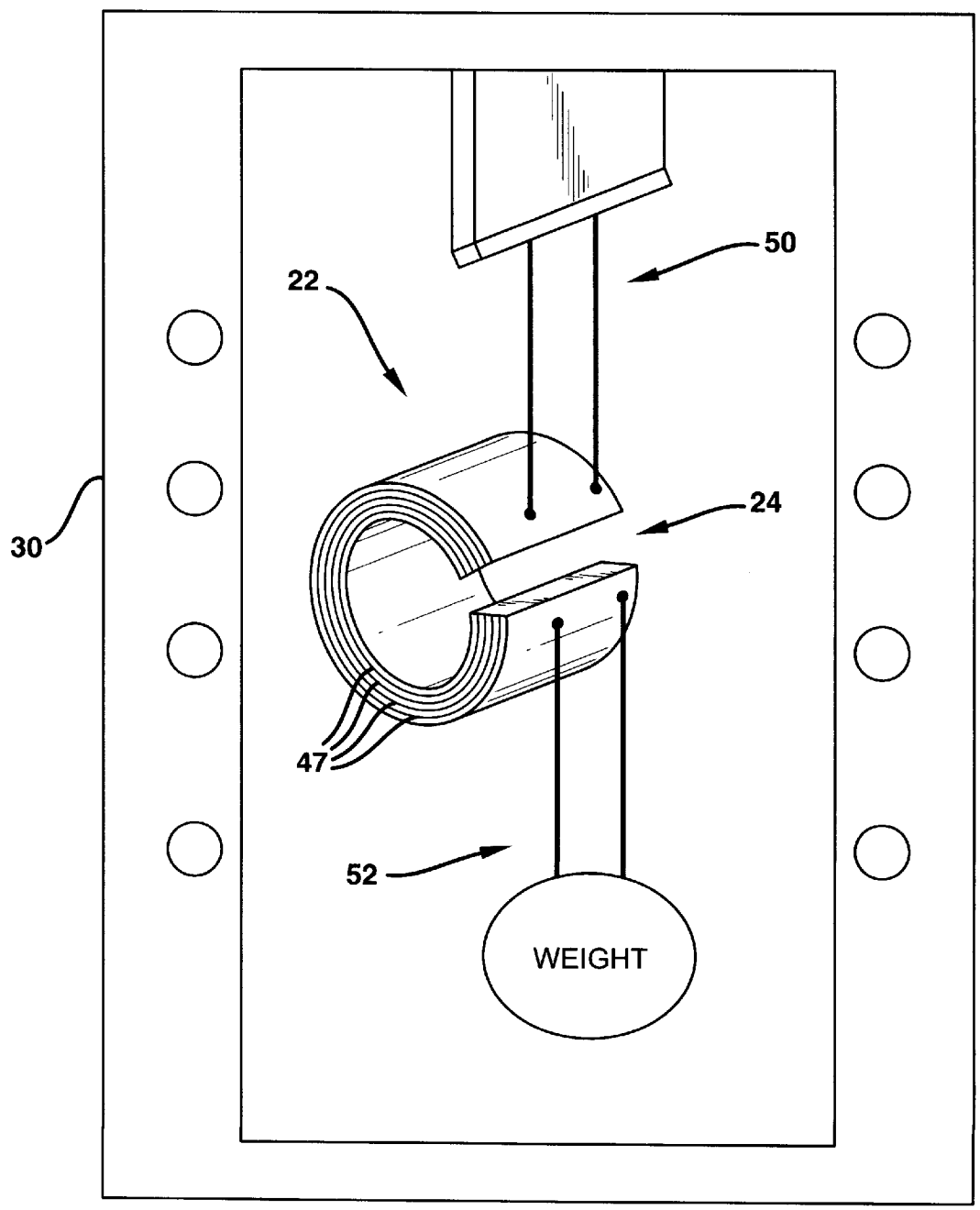
FIG. 5 shows a method of the invention.
Figure 6:
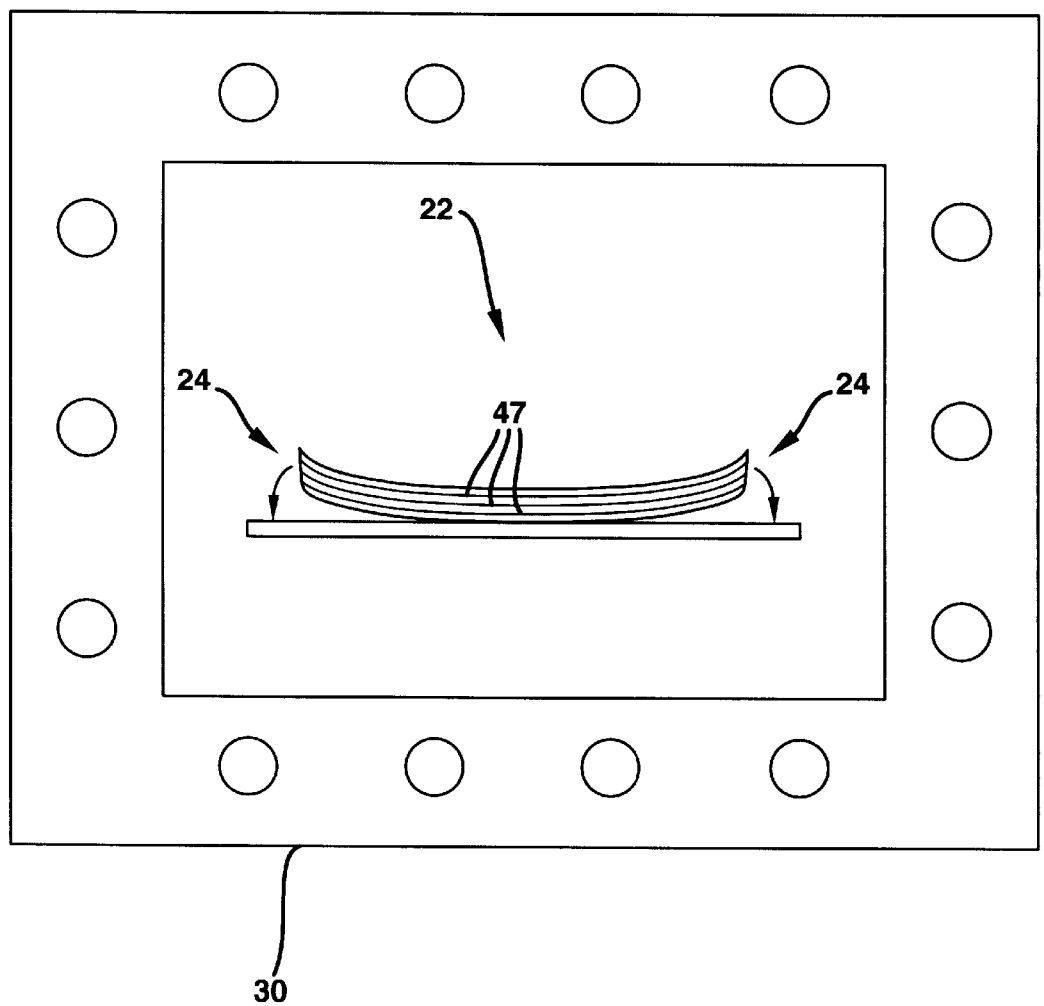
FIG. 6 shows a method of the invention.

In accordance with the invention, the present invention for a method of making a lithography photomask blank includes the step of providing a silicon oxyfluoride glass tube that has an OH content less than 50 ppm. The method preferably includes providing a silicon oxyfluoride glass tube 22 as shown in FIG. 3. The method preferably includes cutting silicon oxyfluoride glass tube 22. As shown in FIG. 4, cut silicon oxyfluoride glass tube 22 is cut and sliced along the longitudinal length of tube 22 to provide longitudinal cut 24, such as can be made by a glass cutting/slicing tool, with cut tube 22 having the general cross-sectional shape of capital "C". The method further includes flattening silicon oxyfluoride glass tube 22 into a flattened silicon oxyfluoride glass tube and photomask blank 20 having a planar top surface 26 and a planar bottom surface 28. As shown in FIG. 5 the cut silicon oxyfluoride glass tube 22 can be opened up by applying an opening and stretching force while evenly heating the entire silicon oxyfluoride glass tube in a glass manipulation heating furnace 30. Opened cut silicon oxyfluoride glass tube 22 can then be further flattened by sagging the opened cut glass tube in a second heated glass manipulation furnace 30 as shown in FIG. 6.

Providing silicon oxyfluoride glass tube 22 includes providing a very dry high purity silicon oxyfluoride glass tube with an OH content less than 50 ppm by weight, more preferably less than 10 ppm, and most preferably less than 1 ppm so that the glass is hydroxyl free. Such OH contents can be measured by measuring the 2.7 micron IR transmission of the glass. Such low OH silicon oxyfluoride glass is preferably obtained by dehydrating soot precursors of the glass before and during the transformation of the precursor soot into glass. In addition to such a low OH level, the provided silicon oxyfluoride glass is of very high purity so that the silicon oxyfluoride glass consists essentially of Si, O and F. It is preferred that the silicon oxyfluoride glass is chlorine free, and preferably has less than 10 ppm Cl, most preferably less than 1 ppm Cl. Such low Cl levels are preferably achieved by flushing out/replacement of Cl and exposure to F containing treatment atmospheres, particularly if the soot is exposed to Cl, such as during dehydrating with Cl. Preferably the silicon oxyfluoride glass has no absorption peak at 900 cm$^{-1}$ for Si—Cl. It is preferred that the silicon oxyfluoride glass is hydrogen free and has less than $1\times10^{17}$ H$_2$ molecules/cm$^3$, preferably less than $5\times10^{16}$ H$_2$ molecules/cm$^3$ more preferably less than $3\times10^{16}$ H$_2$ molecules and most preferably has no detectable hydrogen. Preferably the silicon oxyfluoride glass has no absorption peak at 4,100 cm$^{-1}$ for hydrogen.

It is preferred that the silicon oxyfluoride glass is essentially free of Si to Si bonds and 165 nm oxygen deficiency absorbing centers. Such Si to Si bonds are preferably achieved by providing a silicon oxyfluoride glass produced with non-reducing atmosphere environments which do not have stoichiometrically low levels of oxygen present. Preferably the SiO$_2$ molecules and the glass are produced with stoichiometric or near stoichiometric levels of oxygen to minimize the formation of oxygen deficient Si to Si bonds. Preferably the glass has a 165 nm measured transmission of at least 75%, more preferably at least 80% and most preferably at least 85% per 5 mm thickness. Preferably the glass has a 157 nm internal transmission of at least 80%/cm and a 165 nm internal transmission of at least 85%/cm. More preferably the silicon oxyfluoride glass has a 157 nm internal transmission of at least 85%/cm and a 165 nm internal transmission of at least 90%/cm.

Preferably the silicon oxyfluoride glass does not exhibit a 215 nm absorbtion band after exposure to F$_2$ excimer radiation including the 157 nm wavelength. Most preferably a one mm thick piece of the silicon oxyfluoride glass after at least $0.96\times10^6$ pulses at 4 mJ/cm$^2$—pulse of F$_2$ excimer laser 157 nm radiation the glass has less than a 0.01 optical density (log$_{10}$ transmission) per mm increase at 215 nm and from 160 nm to 190 nm and more preferably less than 0.005 at 215 nm. Preferably the invention includes replacing any Si to Si bonds with Si to F bonds.

Figure 7:
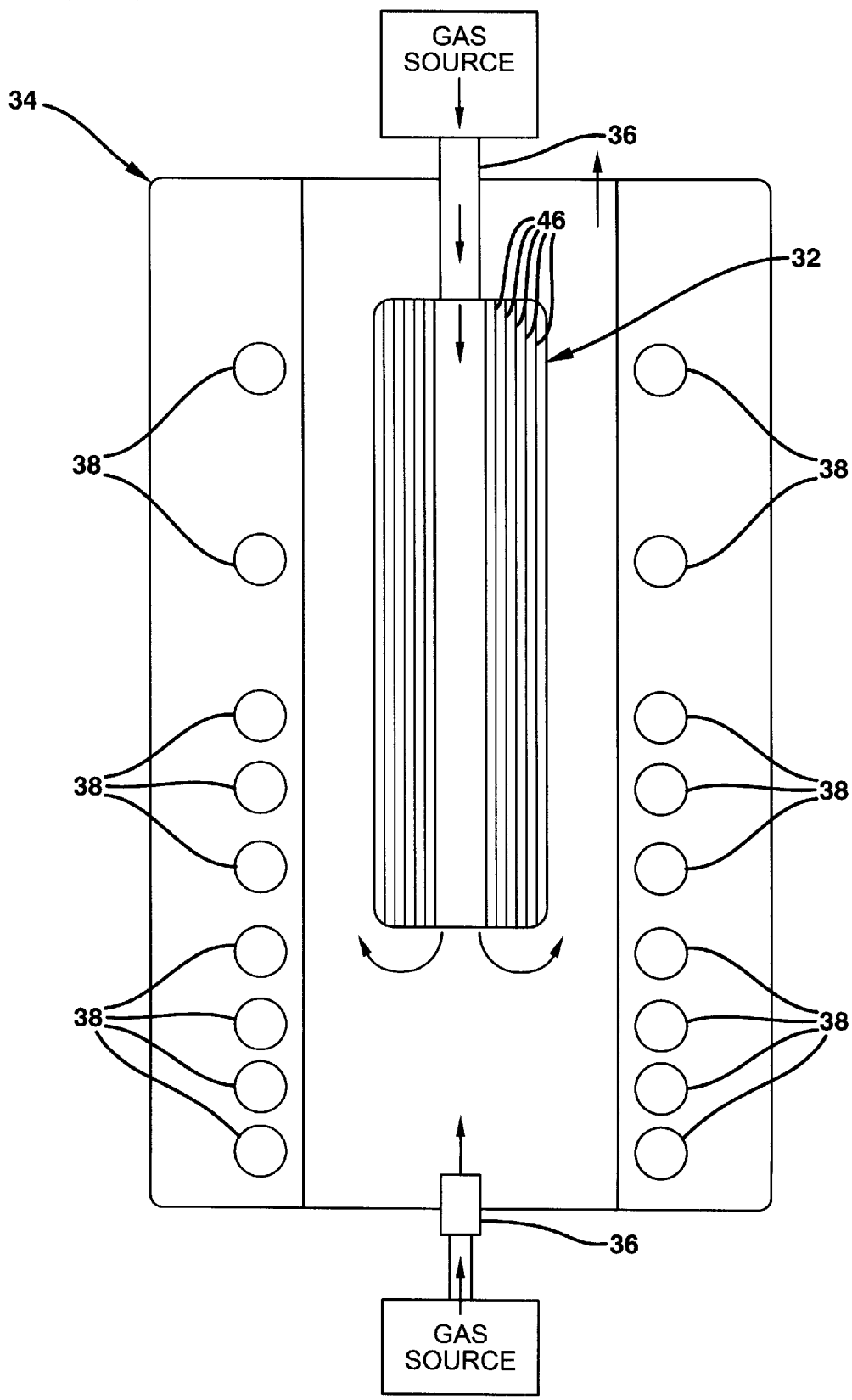
FIG. 7 shows a method of the invention.

A preferred silicon oxyfluoride glass tube is provided for by providing a SiO$_2$ soot tube 32 and dehydrating the SiO$_2$ soot tube to remove OH from the SiO$_2$ soot. In addition to dehydrating the SiO$_2$ soot tube, the method preferably includes replacing some of the silicon (Si) to oxygen (O) bonds with silicon (Si) to fluorine (F) bonds and consolidating the soot tube into a inclusion-free vitreous silicon oxyfluoride glass tube. Preferably the method includes replacing any Si to Si bonds with Si to F bonds. In the SiO$_2$ structure of the precursor soot and the vitreous glass, some of the O$^{2-}$ is preferably replaced with F$^-$ so that the silicate system of the resultant glass tube is somewhat depolymerized with a majority of the bonds in the glass being Si—O—Si bonds and a minority being Si—F bonds. As shown in FIG. 7, SiO$_2$ soot tube 32 is dehydrated, fluorine doped by the formation of Si—F bonds and consolidated in consolidation furnace 34. Appropriate treatment and source gases are supplied to consolidation furnace 34 through gas input 36, to affect dehydration (removal of OH with a dehydration treatment agent), incorporation of F (fluorine source doping gas) and inclusion-free consolidation (preferably helium) of soot tube 32 into silicon oxyfluoride glass tube 22. The temperature of the heated soot and glass tube in furnace 34 can be controlled by adjusting the amount of energy supplied to heating elements 38 or moving the placement of the tube within furnace 34 in that the furnace has at least two temperature zones.

Figure 8:
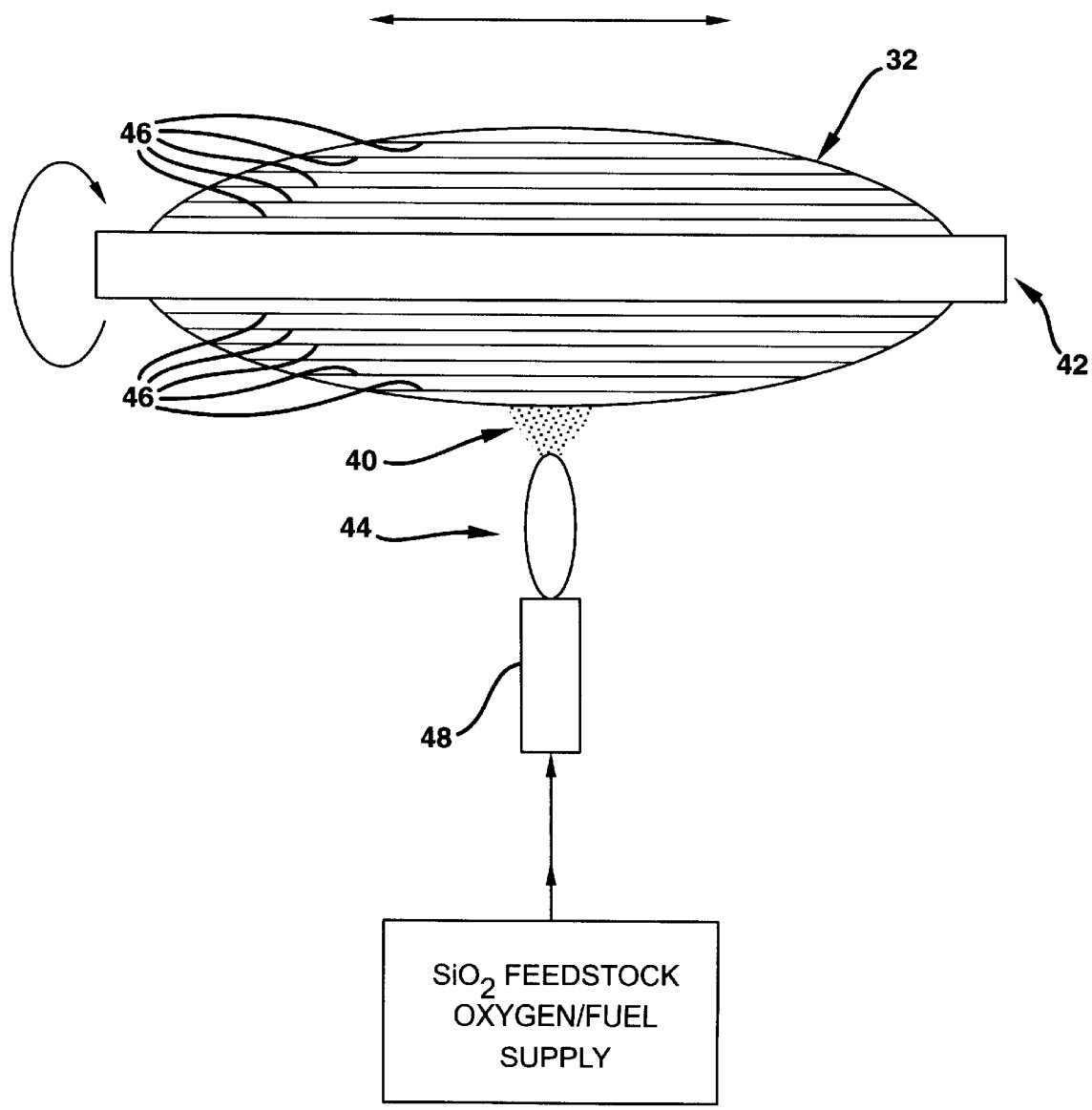
FIG. 8 shows a method of the invention.

The preferred method of providing a silicon oxyfluoride glass tube includes depositing SiO$_2$ soot 40 onto a circular cross-section support member 42. SiO$_2$ soot 40 is preferably deposited from SiO$_2$ soot source 44 which is oriented normal to the horizontal longitudinal axis of support member 42 so that layers 46 of SiO$_2$ soot are formed around support member 42, as shown by the cross-sectional depiction of soot tube 32 in FIG. 8. SiO$_2$ soot source 44 is preferably a conversion site flame produced by conversion site burner 48. SiO$_2$ feedstock such as a silicon halide or a halide free feedstock such as siloxane is delivered to burner 48. The conversion site flame is produced and supported by delivering oxygen and a fuel, such as hydrogen and/or natural gas to burner 48. The SiO$_2$ feedstock is converted in the conversion site flame into SiO$_2$ soot 40 and deposited from soot source conversion site flame 44 towards support member 42. Silicon halides such as a silicon chloride (silicon tetrachloride—SiCl$_4$) and silicon fluoride (silicon tetrafluoride—SiF$_4$) are preferred SiO$_2$ feedstocks. Siloxane SiO$_2$ feedstocks such as cyclic siloxanes and particularly high purity redistilled octamethylcyclotetrasiloxane (purity of at least 99 wt. % thereof), are preferred in terms of SiO$_2$ soot generation and deposition efficiency. Additionally they provide a chlorine free soot. As shown in FIG. 8, SiO$_2$ soot source 44 and burner 48 are preferably positioned normal to the center axis of support member 42, while relative motion between support member 42 and SiO$_2$ soot source 44 is generated so that the deposited soot 40 forms soot tube 32. A preferred soot tube forming pattern is achieved by rotating support member 42 while producing translational movement along the longitudinal length of support member 42 such as by sweeping burner 48 back and forth. Circular cross-section support member 42 can be a hollow tube or solid rod, preferably made from an appropriate refractory deposition target material. Support members of alumina, silica, quartz, high purity fused silica glass, or silicon oxyfluoride glass are preferred. Alumina support members (hollow or solid) are particularly preferred in that they can be removed from the soot body after deposition, and before dehydration and consolidation. A hollow alumina tube is preferred and is removed from the soot after terminating soot deposition to provide soot tube 32. The non-alumina support members are less preferred in that they can not be easily removed from the soot body after deposition since the soot sticks to the support member. Non-alumina support members such as silica or quartz bait tubes are a preferred alternative in that they maintain the inside diameter of the tube through consolidation, and then are removed from the tube after consolidation, such as by core drilling. Such silica or quartz inside diameter maintaining support members are removed after consolidation to avoid cross-contamination of the silicon oxyfluoride glass and avoid cracking during sagging. When support member 42 is a hollow tube, added support of the deposited soot can be provided by pressurizing the interior of the support tube with a fluid, preferably gas such as an inert gaseous fluid of nitrogen or the noble gasses. Additionally, if support member 42 is a relatively thin walled tube compared to the thickness of the resultant photomask blank, support member 42 can be removed or can be incorporated into the finished photomask blank, particularly if the support member glass composition is compatible with the soot body and the silicon oxyfluoride glass and is transparent at the 157 nm wavelength, such as a silicon oxyfluoride glass tube support member 42 which will not cause contamination and cracking during the manufacturing steps, preferably such as a silicon oxyfluoride glass tube support member 42 with comparable matching silicon oxyfluoride composition. After forming soot tube 32, the SiO$_2$ soot tube is dehydrated and doped with fluorine and consolidated into a silicon oxyfluoride glass tube. As shown in FIG. 7, $SiO_2$ soot tube 32 is positioned vertically in vertically oriented gas treatment consolidation furnace 34. Appropriate high purity treatment gases are input through gas input 36 and used to treat soot tube 32 and provide an appropriate consolidation atmosphere for the soot tube. OH is removed from $SiO_2$ soot tube 32 and fluorine is incorporated into the $SiO_2$ soot and consolidating glass using dehydrating treatment gases, fluorine doping treatment gases, sintering treatment gases, dehydrating treatment temperatures, fluorine doping treatment and sintering temperatures. Removing OH from $SiO_2$ soot tube 32 includes heating the $SiO_2$ soot in a dehydrating atmosphere, which is maintained by supply of a dehydrating gas through input 36, preferably with a bottom and top input, preferably with the top input 36 inputting into the interior center line of the subject tube, and the bottom input 36 inputting into the interior of the furnace with waste gas exhausted form the top of the furnace. Preferably the dehydrating atmosphere includes chlorine as a dehydrating gaseous agent. Preferred chlorine dehydrating gaseous agents are $Cl_2$, $SiCl_4$, and $CCl_4$, $SOCl_2$, with $Cl_2$ most preferred. In addition to the chlorine dehydrating gaseous agent, the majority of the dehydrating atmosphere by volume % (flow rate, partial pressure), is comprised of high purity helium. In a preferred method the dehydrating atmosphere also includes fluorine. The fluorine can be an additional dehydrating agent in the atmosphere such as with a chlorine/fluorine/helium dehydrating atmosphere or the fluorine can be the primary dehydrating agent such as a fluorine/helium dehydrating atmosphere with fluorine the minority by vol. %. Such a fluorine/helium dehydrating atmosphere is preferred in that chlorine contamination of the glass is minimized. Silicon fluoride, preferably $SiF_4$, is the fluorine dehydrating agent with $CF_4$ as an alternative, and $C_2F_6$ as an additional alternative fluorine dehydrating agent. $CF_4$ is a preferred drying/doping agent in that it provides improved drying compared with drying with $SiF_4$. $SiF_4$ is preferred for the fluorine doping because it gives a more uniform F profile than $CF_4$. Incorporating fluorine into the $SiO_2$ soot includes heating the $SiO_2$ soot in an atmosphere containing F, preferably at a fluorine doping treatment temperature greater than the dehydrating treatment temperature. The atmosphere containing F preferably includes silicon fluoride ($SiF_4$) as the F doping agent, with $CF_4$ as an alternative F doping agent. As with the dehydrating treatment atmosphere, helium preferably makes up the majority of the atmosphere. Preferably the supply of the F doping agent such as $SiF_4$ is continued while the soot is sintered and consolidated into the nonporous silicon oxyfluoride glass to insure proper incorporation of F into the glass and inhibit the removal of F from the glass. Preferably the soot is first dehydrated at a temperature in the range from preferably 900–1100° C. more preferably 1000–1100° C. such as with a $Cl_2$/helium atmosphere and a temperature of about 1100° C., then F doped at a temperature in the range from preferably 1125–1325° C. more preferably 1150–1250° C. such as with a $SiF_4$/helium atmosphere and a temperature of about 1225° C., then sintered in a sintering atmosphere in the range from preferably 1350–1550° C. more preferably 1450–1500° C. such as helium/$SiF_4$ atmosphere and a temperature of about 1450° C. The transition from the low dehydrating temperature, to the medium F doping temperature, to the high sintering temperature can be achieved by increasing the energy supplied to heating elements 38, and is preferably achieved by moving the soot tube into a high temperature zone in the consolidation furnace. Preferably the bottom part of furnace 34 has a different type of heating elements than the lower temperature zone. It is preferred that the higher temperature zone is maintained at a higher temperature in the range from 1450–1500° C. for sintering the soot preform. As an alternative to F doping after formation of the SiO2 soot tube, F can be doped into the SiO2 during the formation of the SiO2 soot using a fluorine feedstock source. This is a preferred alternative to incorporating F into the $SiO_2$. Such fluorine doping during SiO2 soot formation and deposition can be used as an alternative to subsequent fluorine doping stops when the fluorine doping level is sufficient and is maintained at a sufficient level through consolidation. In a preferred alternative embodiment fluorine doping during soot formation and deposition is utilized as a supplement/addition to subsequent fluorine doping steps. With fluorine doping at formation and then use of fluorine containing treatment atmospheres in subsequent process stops, elevated fluorine levels can be maintained based on equilibrium dynamics of fluorine content and presence prior to consolidation. Preferably with fluorine doping during formation deposition, the final outer layers of soot made on the soot tube are of a lower permeability and porosity than the inner earlier layers, so the escape of fluorine after deposition is inhibited. Such lowering of soot layer permeability to can be achieved by decreased feedstock rates to the burner, hotter burner temperatures, denser soot, and slower soot burner tranverse rates. In a further alternative a low permeability and nonporous exterior outer layer may be used to inhibit fluorine escape and control the flow and content of treatment gasses within the soot tube. Such a low permeability and nonporous glass layer may be formed on the exterior of the soot tube using a very local densifying consolidating heat source, preferably a non-flame heat source such as a radiative heat generator.

$SiO_2$ soot tube 32 is dehydrated, F doped, and consolidated in furnace 34 to result in a silicon oxyfluoride glass tube 22 that consists essentially of Si, O, and F, preferably with the glass having a F wt. % concentration ranging from about 0.5 to about 2.5 wt. % and an OH wt. % content less than 1 ppm, and preferably chlorine and hydrogen free.

Glass tube 22 is preferably provided by first the removal of OH from $SiO_2$ soot tube 32, then fluorine is incorporated into the $SiO_2$ soot which is consolidated into a glass that contains at least 0.5 wt. % F, preferably with a fluorine weight % in the range from about 0.5 to about 2.5 wt. % F, more preferably 0.5 to 2 wt. % F, and most preferably 0.5 to 1.5 wt. % F. Such fluorine levels can be achieved by consolidating the soot into a glass in an atmosphere containing F, or consolidating in a helium atmosphere after doping the soot with F. A preferred method of treating $SiO_2$ soot tube 32 is OH removal by heating the soot to a temperature in the range from 900 to 1100° C. in an atmosphere containing Cl, incorporating fluorine into the dehydrated soot by heating to a temperature in the range from 1125 to 1325° C. in an atmosphere containing F with F also displacing Cl in the soot, and then sintering the F doped soot at a temperature in the range from 1350 to 1550° C.

When the support member such as an alumina support tube is used and removed from the soot preform before consolidation, the inside diameter of the tube is substantially reduced during consolidation. Machining of the resulting consolidated glass tube such as by core-drilling may be used to obtain the desired inside diameter and wall thickness.

Figure 9:
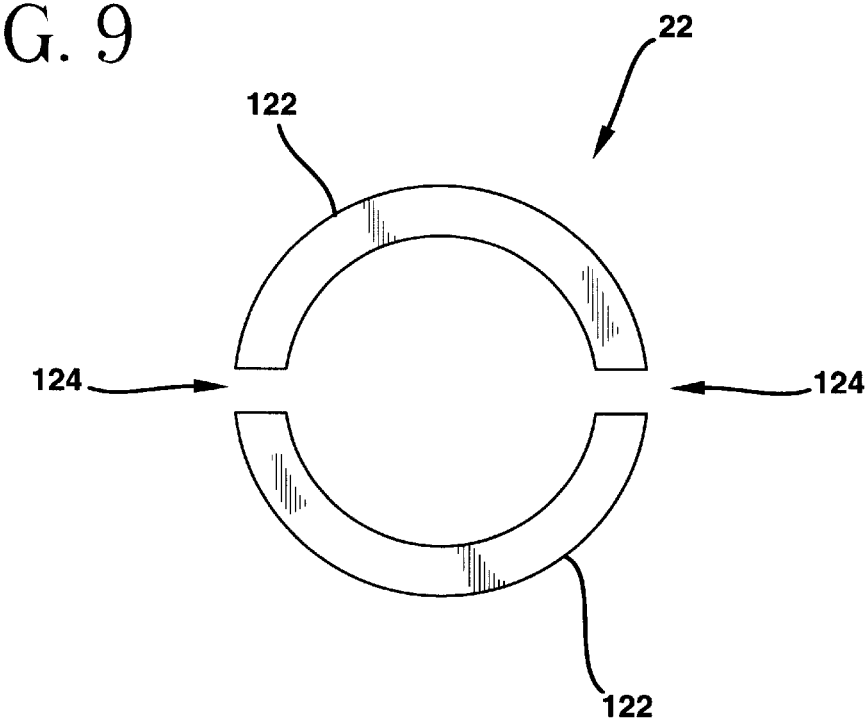
FIG. 9 is a side view of the invention and shows a method of the invention.
Figure 10:
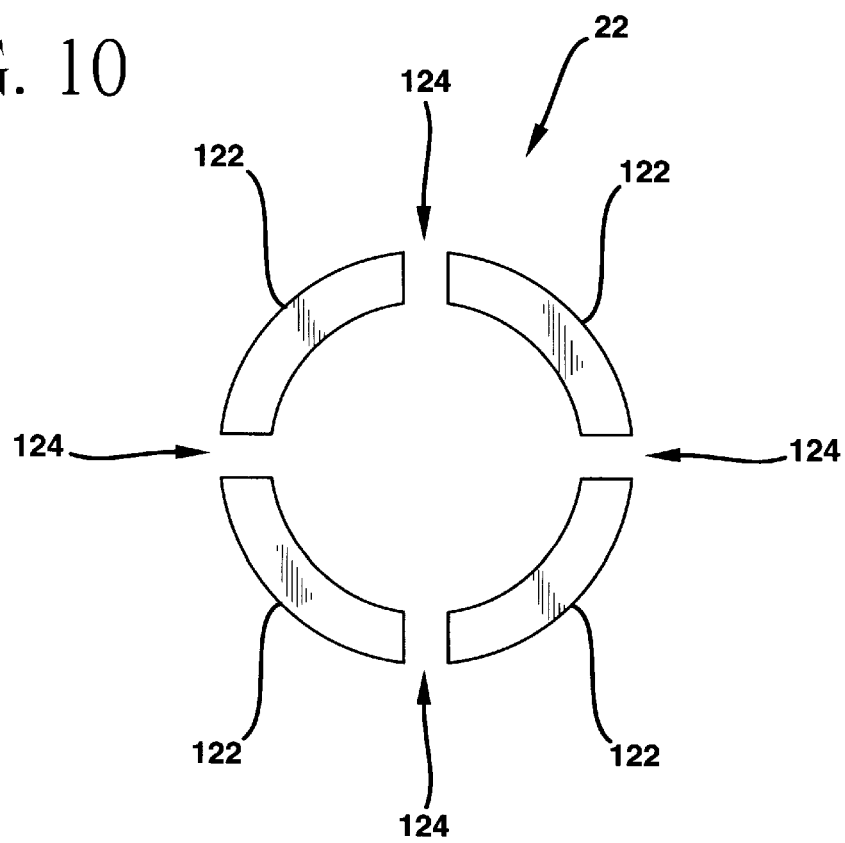
FIG. 10 is a side view of the invention and shows a method of the invention.
Figure 11:
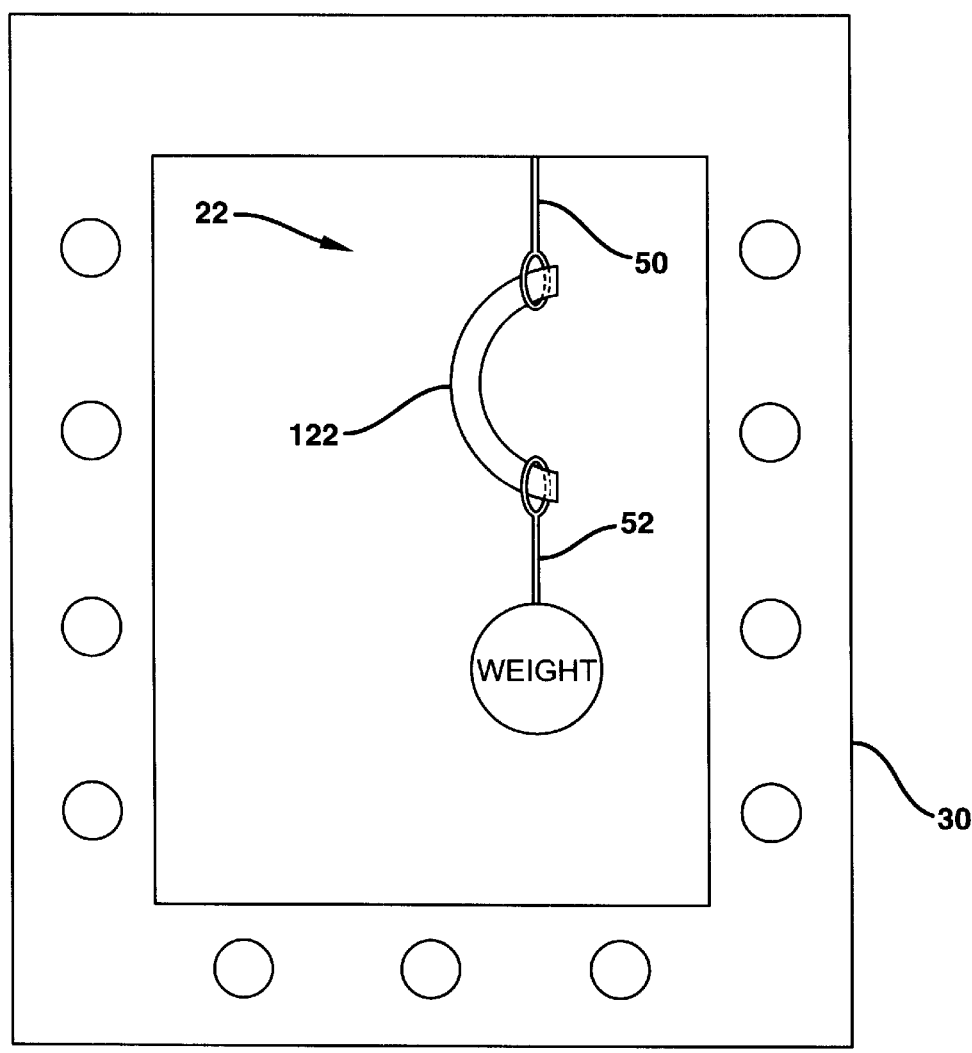
FIG. 11 shows a method of the invention.
Figure 12:
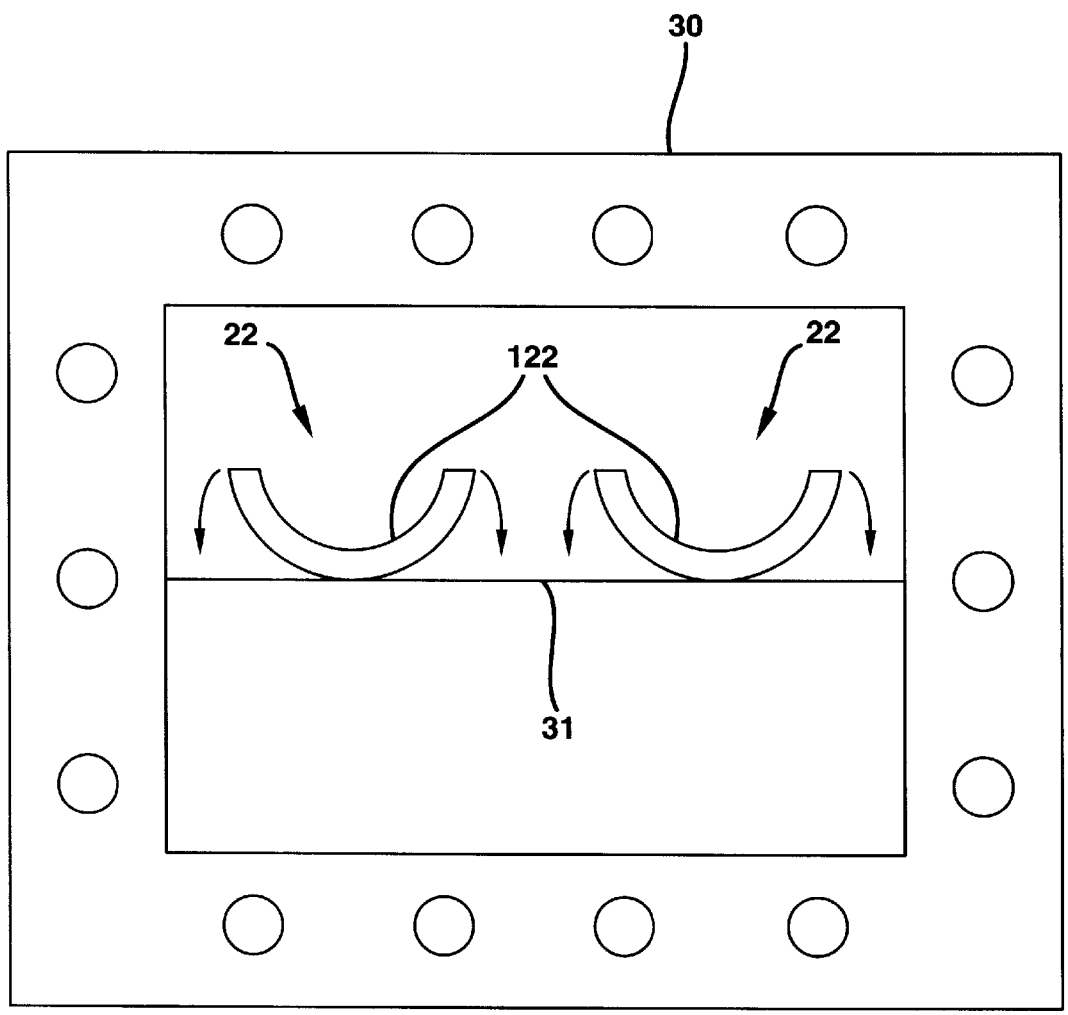
FIG. 12 shows a method of the invention.
Figure 13:
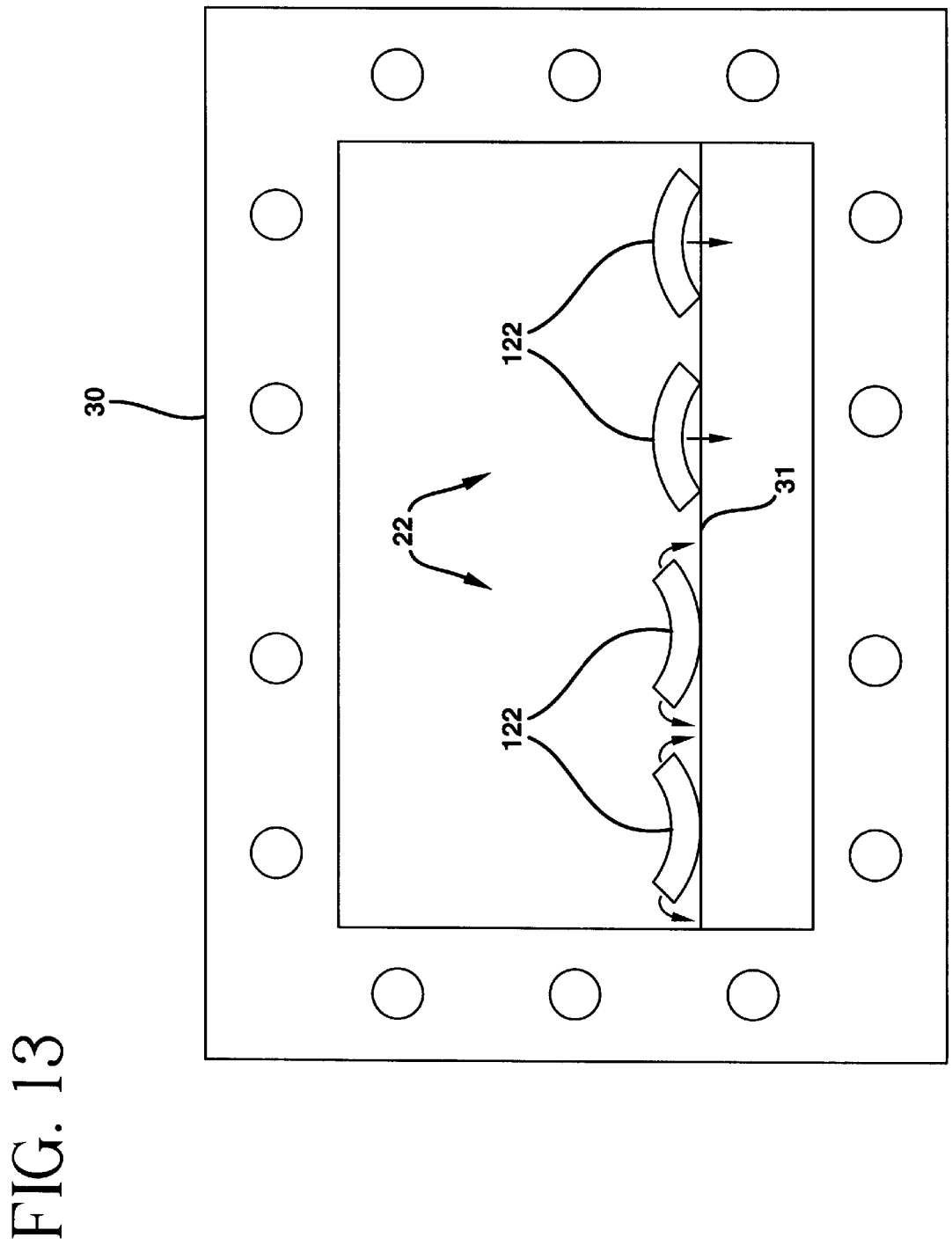
FIG. 13 shows a method of the invention.

As shown in FIG. 3 and FIG. 4, silicon oxyfluoride glass tube 22 has a longitudinal length L and cutting tube 22 includes cutting along this longitudinal length to form longitudinal cut 24. In a preferred embodiment, tube 22 is only cut once so that cut 24 results in only one piece of glass and providest a cross-sectional tube shape resembling a tightly closed "C" shape. The cut tube is then flattened. In an alternative embodiment, silicon oxyfluoride glass tube 22 is cut into at least two separate longitudinal pieces 122 with at least two longitudinal cuts 124, preferably with the cuts equally spaces around the circumference of tube 22. As shown by the end view of tube 22 in FIG. 9, tube 22 is cut in half with longitudinal cuts 124. As shown by the end view of tube 22 in FIG. 10, tube 22 can be cut into four equal quarters with four longitudinal cuts 124. As an alternative to a single cut of tube 22, tube 22 is cut into halves, thirds or quarters. Cutting silicon oxyfluoride glass tube 22 into more than one piece halves, thirds, and fourths is preferred when the inside circumference of tube 22 is two, three or four times the width of the desired photomask and photomask blank. Cutting into fractions is a preferred method when the inside circumference of the tube is substantially larger than the width of the desired photomask blanks. As shown by FIG. 11, C-shaped or half tubes 122 can be flattened into planar photomask blank member by hanging and stretching, followed by sagging, similar to flattening tube 22 with a single cut 24. Alternatively, half tubes 122 can be directly sagged in furnace 30 as shown in FIG. 12. Similarly third tubes and quarter tubes can be directly sagged in furnace 30 as shown in FIG. 13. It is preferred that the tube fractions are positioned in the curved up position, for beneficial flattening.

It is preferred that the consolidated glass tube is provided with the desired inside diameter and wall thickness prior to cutting and flattening. Such inside diameter and wall thickness is preferably provided by machining the tube such as by core-drilling.

Flattening silicon oxyfluoride glass tube 22 includes heating the tube and applying a deforming force to the heated tube. As shown in FIG. 5 and 11, a preferred step of flattening tube 22 is by hanging the cut tube in a heated glass manipulation furnace 30 and applying a downward force on the cut tube, such as by attachment of a pulling weight. Hanging suspenders 50 provides for suspending the cut tube from a position proximate the top of furnace 30. Hanging suspenders 50 preferably comprise platinum wire members attached to tube 22 proximate cut 24. The platinum wires can be attached by drilling holes in the tube and running the wires through the holes. Suspenders 50 and the platinum wires can be directly attached to the top of furnace 30 (FIG. 11) or indirectly attached to furnace 30 with additional structure (FIG. 5). Similarly the flattening downward force can be applied to tube 22 by similar attachment of platinum wires and a hanging weight, preferably a silica hanging weight, to the opposite cut end of tube 22. Force applying member 52 applies a flattening force to tube 22 to assist in uncurling heated tube 22. Preferably, furnace 30 is heated to at least 1480° C. so that force applying member 52 produces an appropriately flattened tube. The preferred temperature range for heating tube 22 contained in furnace 30 for this uncurling flattening by hanging and stretching is in the range from 1480–1580° C. and is preferably less than 1600° C. such as about 1500° C.

In addition to such hanging, further flattening of tube 22 can be achieved by heating the tube to a sagging temperature and applying a deforming force to the heated tube. As shown in FIG. 6, the uncurled cut tube 22 resulting from the hanging process depicted in FIG. 5 can be further flattened by sagging in glass manipulation furnace 30. In the preferred step of sagging the tube into a flattened cut tube, furnace 30 is heated to a high enough temperature so that the weight of the elevated unsupported sections of cut tube 22 is a sufficient deforming force to sag the cut tube into a flattened planar surface glass member. In addition to FIG. 6, FIGS. 12–13 illustrate the sagging of cut tube 22 that has been cut into more than one long cut tube section. Preferably furnace 30 is heated to a softening temperature high enough to sag cut tube 22 and maintained at a temperature below the flowout temperature so that the cut tube is flattened while flowout and thinning of the silicon oxyfluoride glass is substantially inhibited. The sagging temperature is preferably in the range from 1700–1800° C., and more preferably 1720–1760° C., and most preferably is centered about 1730° C. In addition to flattening by applying a deforming force to furnace heated tube 22 such as by hanging and/or sagging, a deforming force can be applied to the furnace heated tube 22 by pressing. In applying a pressing force to cut tube 22, in addition to the tubes' own weight, a lower deforming temperature can be used. In applying a pressing force the tube can be treated to a temperature of about 1550–1650° C. and a pressing force can be applied and distributed onto the cut tube with a flat planar pressing member. Preferably the surfaces of tube 22 which are pressed are covered with a platinum foil to isolate the glass tube. An alternative flat planar pressing member is a high purity dense graphite slab. High purity dense graphite members are also utilized as beneficial setters and furnace surfaces in the practice of the invention.

In addition to flattening the glass member, heating of the glass is preferably conducted in hydrogen free heated environments to insure that the glass is not contaminated with hydrogen and to allow any $H_2$ molecules entrapped in the glass to escape and outgas, to result in photomask blanks that have no detectable amount of hydrogen.

Heating the tube comprises heating the tube to the glass deforming softening point temperature wherein the viscosity of the glass is lowered so that the application of the deforming force deforms the glass tube.

Figure 20:
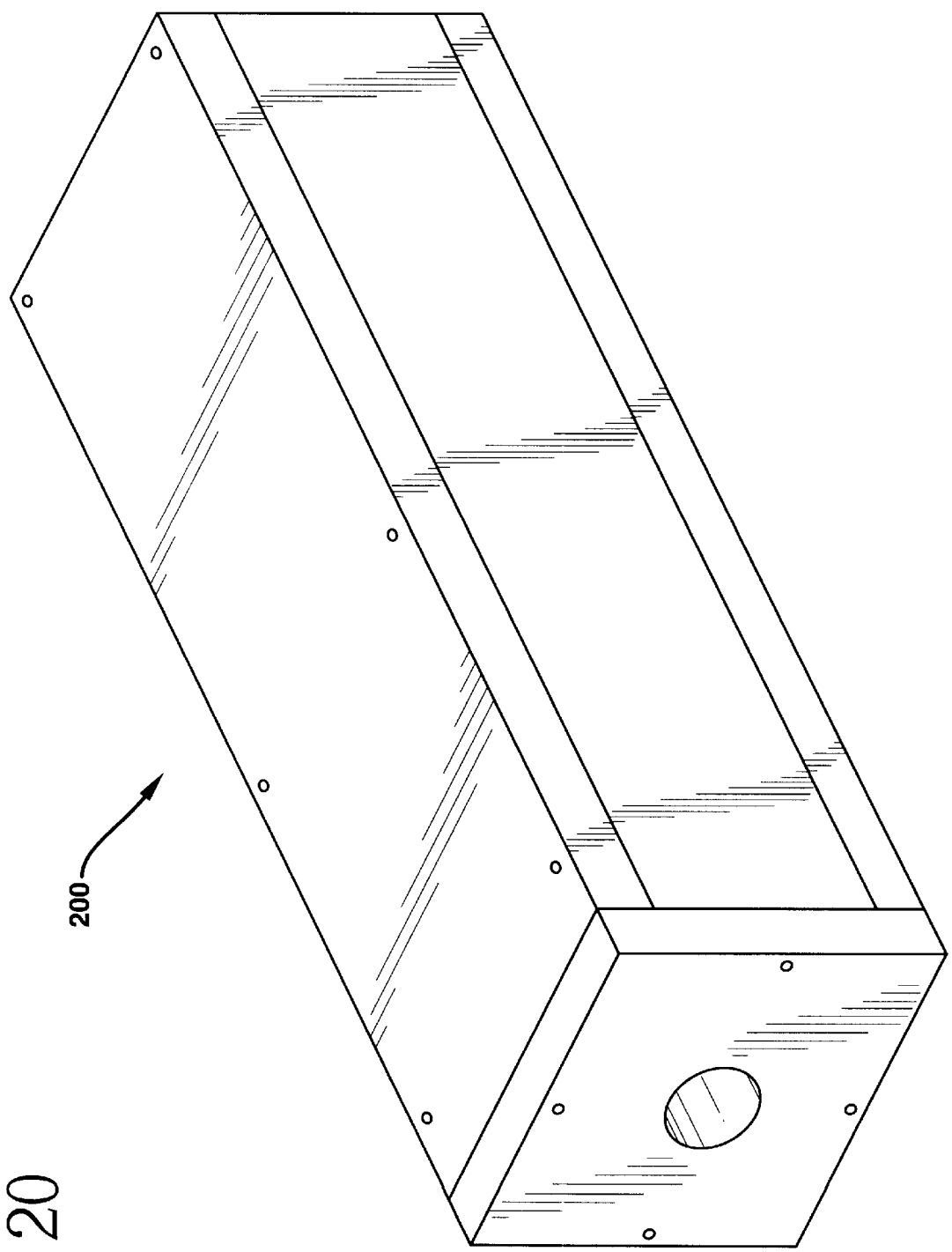
FIG. 20 is a perspective view of an embodiment of the invention and shows a method of the invention.

Alternatively, flattening the silicon oxyfluoride glass tube 22 by heating the tube 22 and applying a deforming force to the heated tube 22 includes applying a deforming fluid pressure. Such a deforming fluid pressure force can be applied by creating a fluid gas pressure difference between the interior and exterior of the heated glass tube. Such deforming pressure differences may be created such as by evacuating the interior of the glass tube or pressurizing the interior of the glass tube. Such heating and applying a deforming force to the heated tube to flatten the tube preferably comprises molding the heated glass tube. As an alternative to the preferred embodiment of molding with a flat sided mold, the heated glass tube may be flatten by application of a deforming pressure difference without physically contacting a mold. Such moldless flattening preferably includes evacuating the tube in order to collapse the tube into a flattened collapsed tube absent of an interior glass force space. The preferred embodiment of flattening with a deforming pressure difference includes molding with a flat sided mold. Molding the heated glass tube comprises providing a flat sided mold, positioning the mold proximate the glass tube, and applying a deforming fluid pressure force to the heated tube wherein the heated tube conforms to the flat sided mold. Flattening the tube preferably includes encompassing silicon oxyfluoride tube 22 with a mold 200 and applying an expanding pressure deforming force to heated tube 22 wherein the heated tube expands into mold 200. Preferably encompassing tube 22 with a mold 200 includes encompassing the tube with a flat sided mold. Such a flat sided mold is preferably a polygonal flat sided mold such as a rectangular, square, triangular, pentagonal, or hexagonal mold. Most preferably, the mold is rectangular, preferably with the rectangle being a square. FIG. 20 illustrates a mold 200 for flattening tube 22. Mold 200 in FIG. 20 has a square interior cross sectional shape for molding tube 22 into a flattened glass tube 22F with a square exterior cross section. Mold 200 is preferably comprised of a refractory (for example, silicon carbide or silicon nitride) type material that is heat resistant, and most preferably is substantially inert to said glass tube 22 so that glass tube 22 is not contaminated by mold 200 during the flattening process. A preferable material is high purity graphite, such as available from Graphite Die Mold, Inc., 18 Airline Park, Durham, Conn. 06422. Alternative mold materials are high purity silicon carbide and high purity silicon nitride.

Mold 200 in FIG. 20 may be constructed using four rectangular slabs of high purity graphite, and assembled together using graphite assembly pins.

Figure 21:
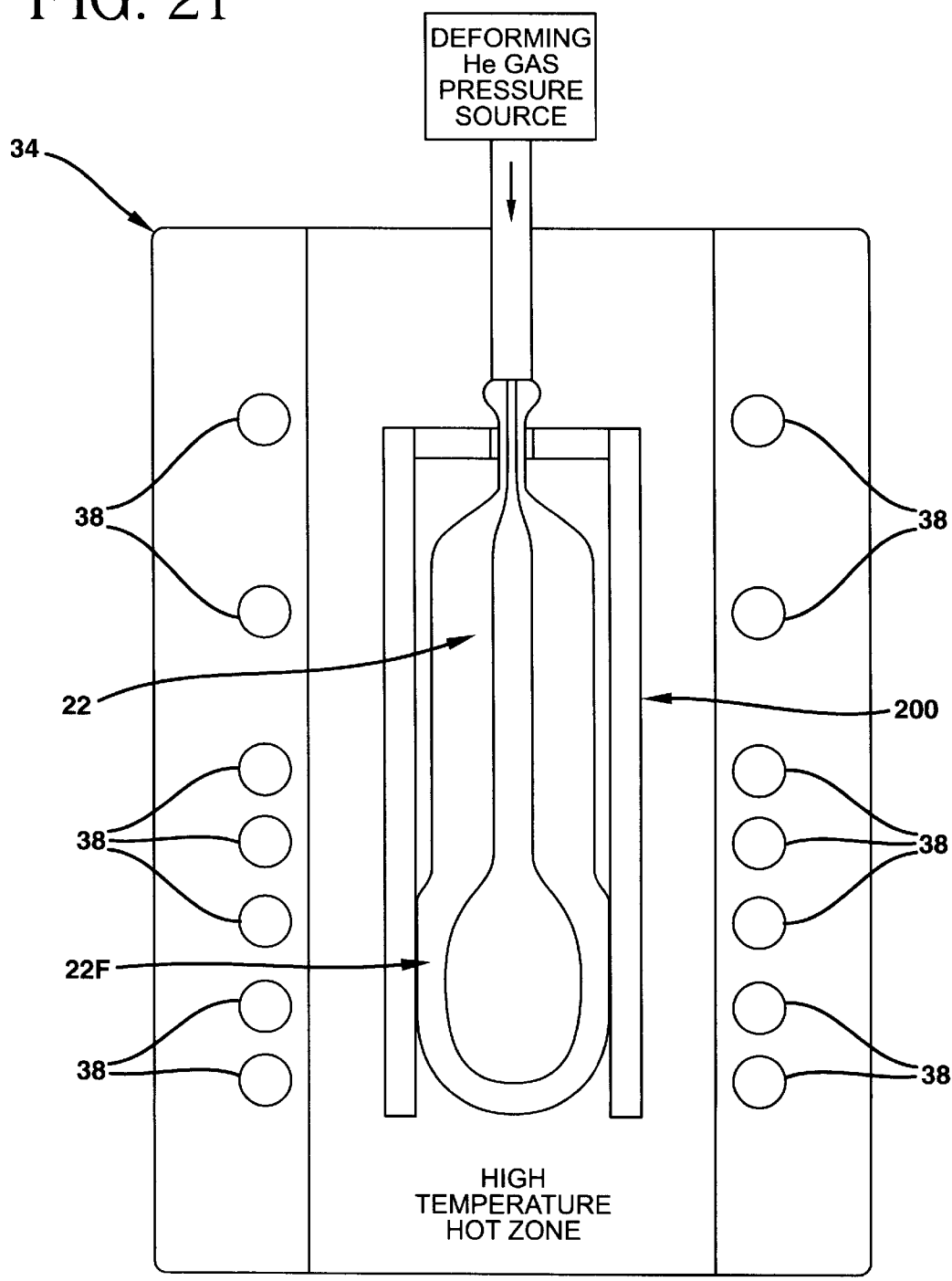
FIG. 21 shows a method of the invention.
Figure 22:
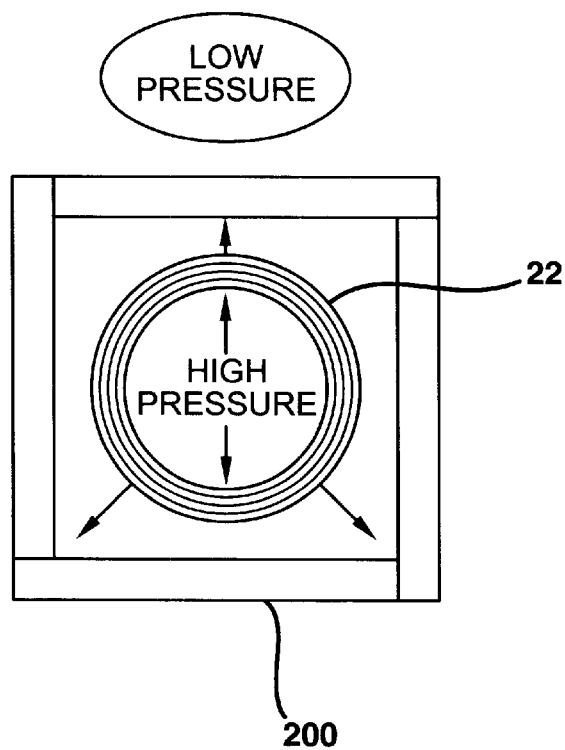
FIG. 22 is a side view and shows a method of the invention.
Figure 23:
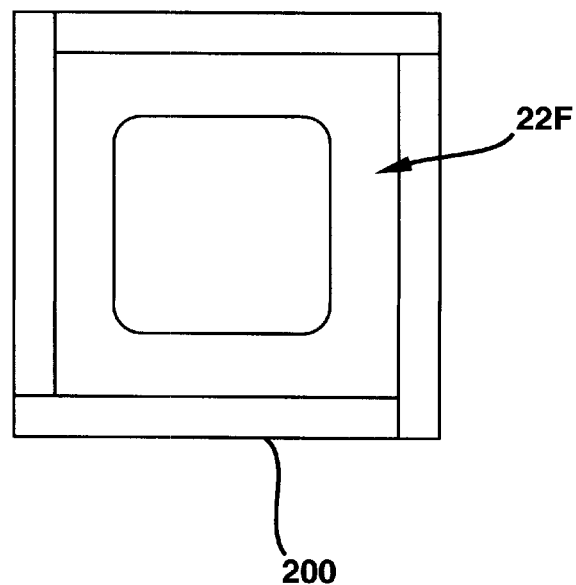
FIG. 23 is a side view and shows a method of the invention.
Figure 24:
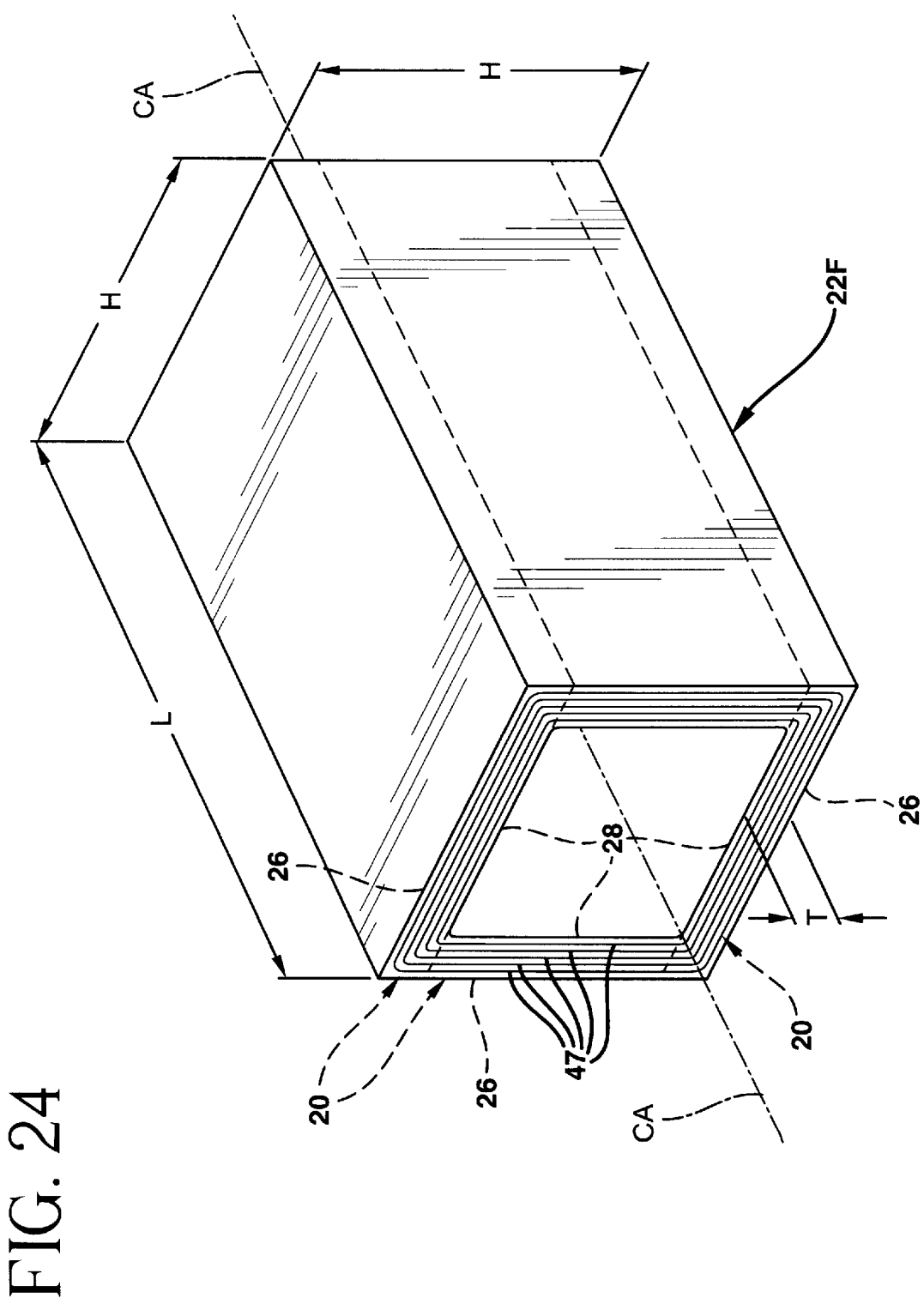
FIG. 24 is a perspective view of the invention and shows a method of the invention.
Figure 25:
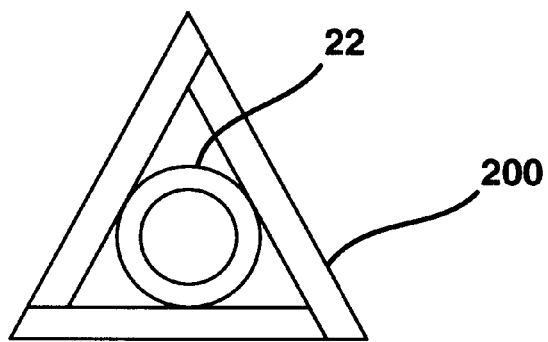
FIG. 25 is a side view of the invention and shows a method of the invention.
Figure 26:
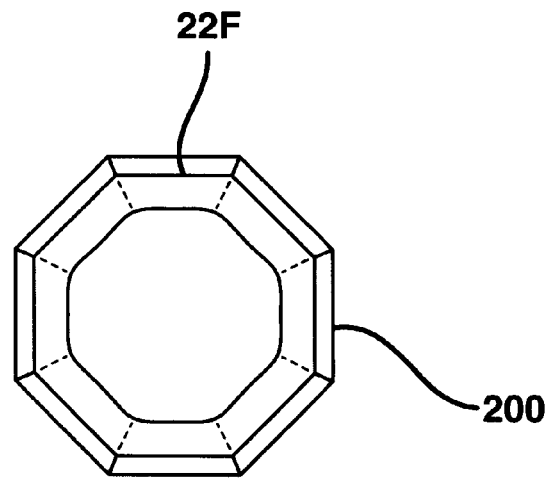
FIG. 26 is a side view of the invention and shows a method of the invention.

As shown in FIG. 22, mold 200 is sized appropriately to tube 22 so that tube 22 can be inserted into mold 200 with mold 200 encompassing the tube. As shown in FIG. 21 tube 22 encompassed by mold 200 is heated and deformed in a glass manipulation furnace 34, such as a He-purged vertical tube furnace. Prior to heating and deforming tube 22, an end of tube 22 is closed and sealed shut, such as by flame working, in order to inhibit the escape of the fluid during expansion deforming of tube 22. Tube 22 inside mold 200 is deformed and flattened using the expanding deforming pressure force of an inert gas. As shown in FIG. 21 a deforming He gas pressure source is utilized to pressurize the interior of heated tube 22 and expand the tube into contact with mold 22 so that the glass tube conforms to the interior cross sectional shape of mold 22. Preferably the pressurizing gas is supplied to the flame worked handle tube end of tube 22 opposite to the closed end of tube 22. FIG. 22 shows undeformed glass tube 22 encompassed by mold 200, FIG. 23 shows deformed flattened glass tube 22F within mold 200 with the glass tube conforming to the square cross sectional shape of mold 200. FIG. 24 shows flattened glass tube 22F removed from mold 200. As shown in FIG. 24 flattened glass tube 22F is cut along the dashed lines to remove a flat side from the tube. FIG. 25 shows a flat sided polygonal cross sectional shaped mold 200 with a triangular shape. FIG. 26 shows a flat sided polygonal cross sectional shaped mold 200 with a hexagonal shape. As shown in FIGS. 20 and 21, tube 22 is positioned inside mold 200 through the bottom opened end of the mold with the handle of tube 22 protruding out through the hole in the top end face of mold 200.

Figure 28:
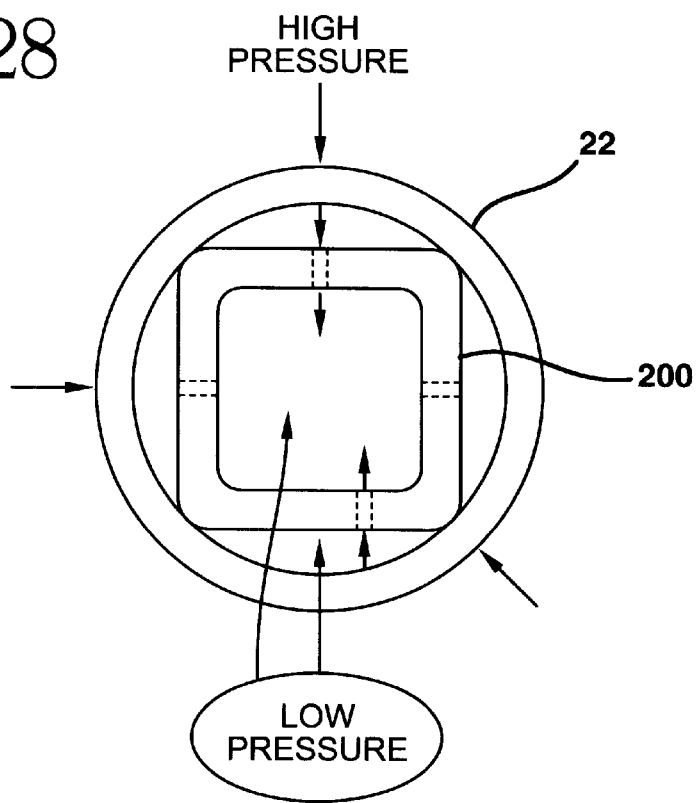
FIG. 28 is a side view of the invention and shows a method of the invention.
Figure 29:
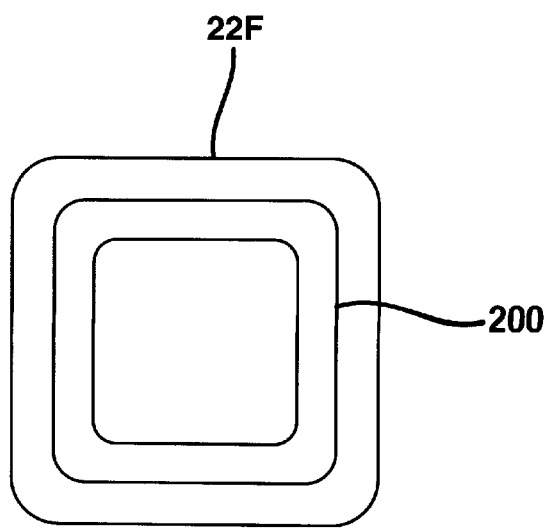
FIG. 29 is a side view of the invention and shows a method of the invention.

In a further embodiment, flattening by molding includes utilizing a mold that is sized smaller than the interior of the glass tube, so that the mold can be positioned inside the glass tube. As shown in FIG. 28, the method includes encompassing mold 200 with tube 22 and applying a collapsing fluid pressure deforming force to heated tube 22 wherein the tube collapses against the mo9ld to result in a flattened tube 22F as shown in FIG. 29. Such collapsing of heated tube 22 onto mold 200 can be achieved by utilizing a vacuum to actively collapse the glass onto the flat sided mold. Such use of a higher pressure gas to collapse the tube can be achieved by evacuating the interior of tube 22, and preferably evacuating the interior of mold 200 when mold 200 is tubular and/or hollow, preferably with the mold having gas permeable conduits. Similar to expanding into mold 200, such collapsing is achieved by isolating the interior environment of tube 22 from its exterior environment and forming a pressure difference between the interior and the exterior environment to deform tube 22 so it conforms with the flat sides of mold 200.

As an alternative to moving mold 200 and tube 22 together into a high temperature hot zone with no relative motion between mold 200 and tube 22, mold 200 can be fixed in a high temperature hot zone and tube 22 moved into the hot zone so that tube 22 deforms and conforms to mold 200 while moving relative to the mold, such as mold 200 fixedly held while heated tube 22 is translated through or around the mold.

Figure 30:
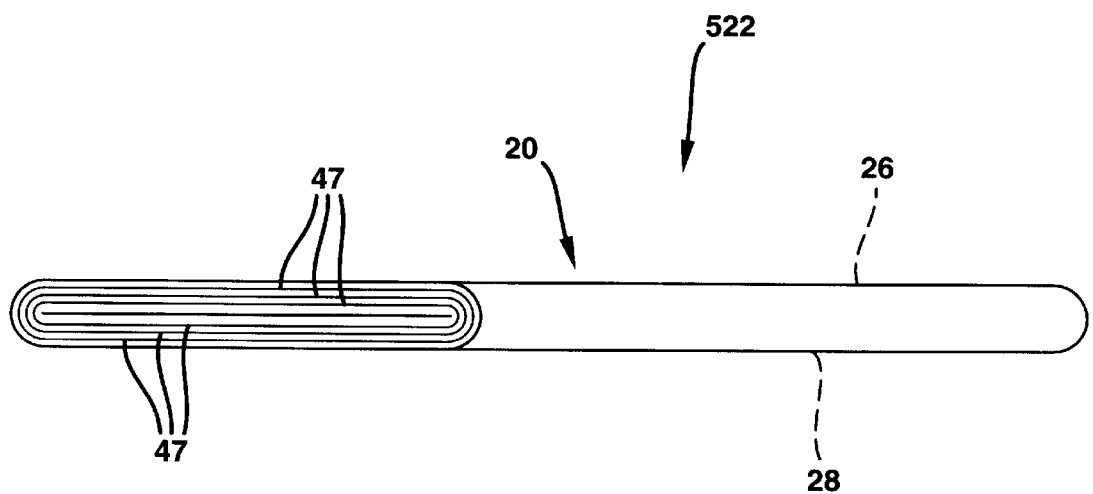
FIG. 30 is a longitudinal side view of an embodiment and method of the invention.

The invention includes a method of making a photomask flat planar glass blank that includes providing a silicon oxyfluoride silica glass tube, heating the glass tube, and evacuating the heated glass tube to collapse the tube into a flattened collapsed tube absent of an interior glass free space. Such evacuating and collapsing can be achieved by sealing the interior of the glass tube from its surrounding exterior environment and applying a vacuum to the interior of the glass tube. Preferably the glass tube 22 has concentric layers of straie 47, and the tube is collapsed into a flat planar collapsed tube 522 with the layers of straie parallel with the top surface and bottom surfaces. The collapsed tube 522 shown in FIG. 30 has parallel layers of straie 47 which are parallel to the top and bottom surfaces of the collapsed tube. Collapsing tube 22 into collapsed planar flat tube 522 preferably maintains the parallel orientation of straie 47 so that they are parallel and aligned with the top and bottom surfaces of a photomask glass blank 20 that can be obtained by appropriate finishing of collapse tube 522 such as by lapping, polishing and cutting.

In preferred embodiments of the inventive method, providing a silicon oxyfluoride glass tube includes providing a tube that has an inside radius of at least 2.5 cm, a thickness of at least 0.6 cm and a length of at least 15 cm. In a further embodiment, the provided tube has an inside radius of at least 3.6 cm, a thickness of at least 0.6 cm, and a length of at least 22 cm. With such provided silicon oxyfluoride glass tubes the tubes preferably have an inside radius less than 5 cm and the provided tube is only cut once with one longitudinal cut 24 as in FIG. 4 and then the single whole cut tube member is flattened.

In alternative preferred embodiments of the invention, the method includes providing a tube 22 that has an inside radius of at least 5 cm, a thickness of at least 0.6 cm, and a length of at least 15 cm. In a further embodiment, the provided tube has an inside radius of at least 7.6 cm, a thickness of at least 0.6 cm, and length of at least 22 cm, with the provided tube cut into more than one tube piece 122 by making more than one cut 124, most preferably cutting tube 22 into two equal halves.

Providing silicon oxyfluoride glass tube 22 preferably includes providing a silicon oxyfluoride glass tube that has concentric layers of straie and the method includes maintaining the relative orientation of the layers of striae so that the layers are parallel to the photomask blank planar surface. A preferred method of providing tube 22 with concentric layers of straie 47 is by consolidating a soot tube 32 with concentric layers of soot 46. The cutting, flattening and forming of tube 22 of the invention maintains the parallel orientation of the layers of straie to each other and result with the layers parallel to the top planar surface 26 and the bottom planar surface 28 of photomask blank 20. The inventive method avoids disrupting the striae formed in the glass and does not remove straie and actually includes maintaining the straie layers so that resultant photomask has straie.

Forming the flattened cut silicon oxyfluoride glass tube into a photomask and photomask blank includes polishing the flattened cut glass tube to provide a smooth flat planar upper surface 26 and preferably also a smooth flat planar lower surface 28. The flattened cut glass tube is double sided finished and polished to a surface roughness ≦0.15 nm rms. Forming may include cutting the resulting rectangular shape of the flattened cut glass tube such as when a circular shaped photomask is desired.

Figure 27:
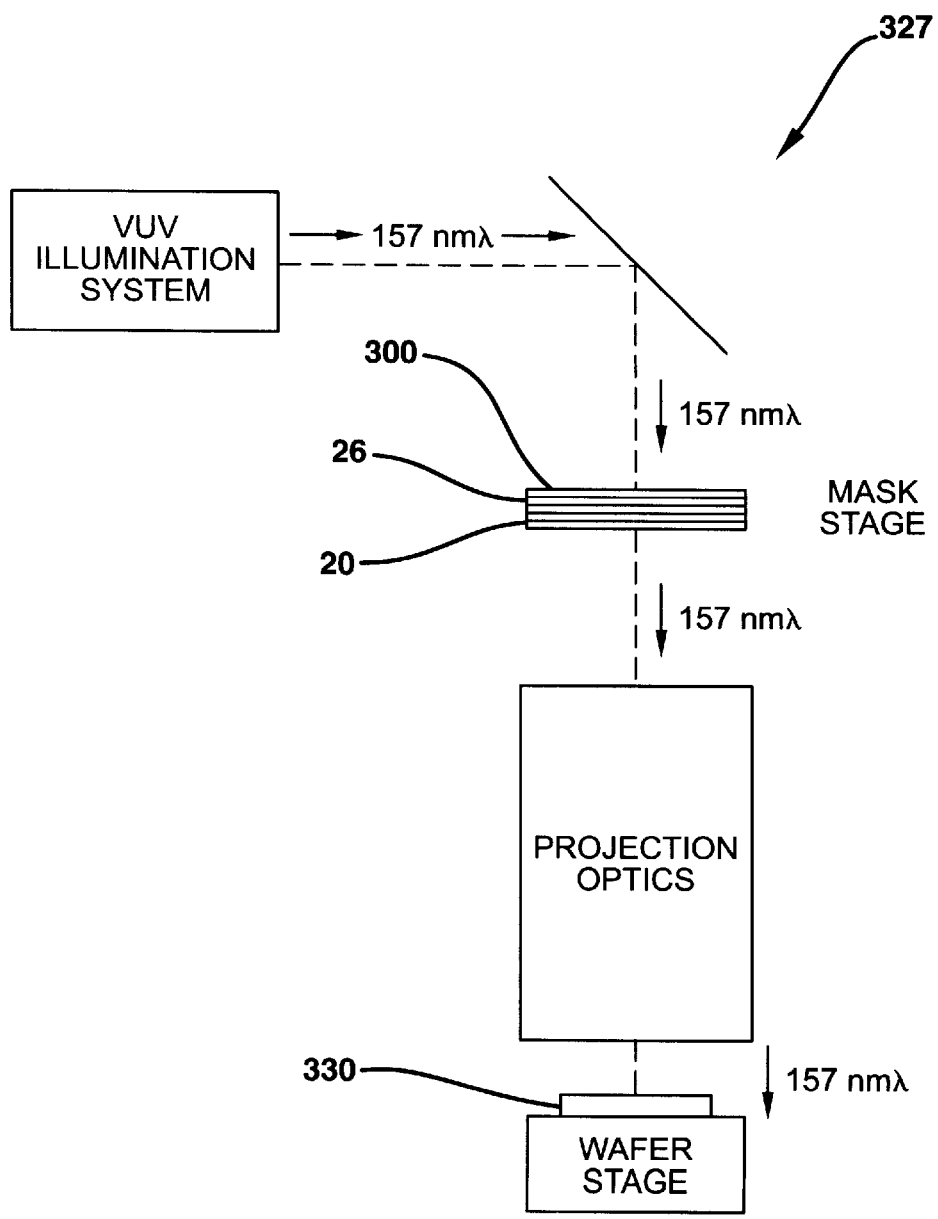
FIG. 27 is a lithography system/process embodiment of the invention.

The invention further includes transmitting 157 nm wavelength light through the formed silicon oxyfluoride glass photomask. Such transmission of 157 nm light through the photomask blank may include inspecting the glass and analyzing the transmission properties of the glass. As shown in FIG. 27, photomask blank 20 is utilized in a VUV wavelength projection lithography system 327. The invention also includes forming a lithographic image pattern 300 (preferably using lithographic resist processing, most preferably Cr film deposition) on the photomask blank planar surface, preferably to result in a 157 nm VUV wavelength lithography patterned transmission photomask. The invention includes impinging VUV light including the 157 nm wavelength on the photomask planar surface to form a projection image pattern and projecting the projection image pattern onto a radiation sensitive material 330. The VUV illumination system emits VUV light below 193 nm, preferably below 165 nm and in the 157 nm region such as emitted by a $F_2$ excimer laser. Photomask blank 20 can also be utilized in phase shifting transmitting photomasks. Alternatively the photomask blank can be utilized in a reflective projection lithography system by forming a reflective lithographic image pattern on photomask blank 20.

In accordance with the invention, the present invention further includes a glass lithography mask preform formed by the methods of the invention. The inventive glass lithography mask preform is comprised of a longitudinal silicon oxyfluoride glass tube which has an OH wt % content ≦10 ppm, a F wt. % concentration ≧0.5 wt. %, with the silicon oxyfluoride glass tube having an inside radius of at least 2.5 cm, a thickness of at least 0.6 cm, and a longitudinal length of at least 15 cm, with the tube having a central axis along the longitudinal length wherein the glass tube has concentric layers of striae centered about the central axis. Silicon oxyfluoride glass lithography mask preform tube 22 preferably consists essentially of Si, O, and F. Preferably the silicon oxyfluoride glass has a 157 nm wavelength transmission percentage of at least 70% per 5 mm thickness of glass.

In an alternative embodiment of the inventive preform tube 22, the silicon oxyfluoride glass tube surrounds a glass support tube 42 which was not removed from the soot tube prior to consolidating the soot into the silicon oxyfluoride glass. Preferably the surrounded support tube 42 is a compatible silica glass tube.

Preferably the inventive glass preform tube 22 has a transmission homogeneity at 157 nm in the range from −2% to +2%. Preferably the preform tube is free of inclusions having a dimension >1 μm, and preferably has a birefringence ≦5 nm/cm. Such preferred glass preform tubes 22 have an inside radius of at least 3.6 cm and a longitudinal length of at least 22 cm. In further embodiments the preform tubes have inside radius of at least 5 cm, and more preferably, at least 7.6 cm and a length of at least 22 cm.

In a preferred embodiment the glass lithography mask preform longitudinal silicon oxyfluoride glass tube has a polygonal shape flat sided cross section. Preferably the mask preform glass tube has a rectangular cross section, which is most preferably a square cross section. The polygonal shape flat sided cross section may comprise flat sided polygonal shapes such as triangular, pentagonal, hexagonal, and octagonal.

The invention further includes a lithography photomask blank 20 with parallel layers of striae that are parallel with the planar surface of the photomask blank, such as produced by the invention. The lithography photomask blank 20 includes a flat planar silicon oxyfluoride glass member with top planar surface 26 and bottom planar surface 28. The silicon oxyfluoride glass member has an OH content ≦10 ppm and a F wt. % concentration ≧0.5 wt. %. The silicon oxyfluoride glass member has parallel layers of striae 47 with the parallel layers of striae substantially parallel with top planar surface 26. Preferably the top planar surface 26 has a surface roughness ≦0.15 nm rms. Preferably the bottom planar surface 28 is substantially parallel with the striae levels and also has a surface roughness ≦0.15 nm rms. Preferably lithography photomask blank 20 has a 157 nm wavelength transmission percentage of at least 70% per 5 mm thickness of the silicon oxyfluoride glass photomask blank. More preferably the flat planar silicon oxyfluoride glass member has a transmission homogeneity at 157 nm in the range from −2% to +2%; and has a birefringence ≦5 nm/cm. Preferably the glass member is free of inclusions having a dimension >1 μm.

Preferably the silicon oxyfluoride glass of lithography photomask blank 20 consists essentially of Si, O, and F. Preferably the glass has a F wt. % content in the range from 0.5 wt. % to 3 wt. %, and also has an OH wt. % content less than 5 ppm., and more preferably an OH wt. % content ≦1 ppm. In a preferred embodiment photomask blank 20 has a thickness of at least 0.6 cm, a length of at least 15 cm, is free of inclusions having dimensions >1 μm, has a transmission homogeneity at 157 nm in the range from −2% to +2% with a 157 nm transmission >70% and a birefringences ≦5 nm/cm.

Lithography photomask blanks 20 preferably have a 157 nm transmissive percentage of at least 70% for a thickness of 5 mm, with such measured transmission through the glass blank piece including reflection losses. More preferably the silicon oxyfluoride glass photomask blank 20 has a measured transmission at 157 nm. of at least 72%, most preferably at least 75% per 5 mm. thickness of the blank. The silicon oxyfluoride glass preferably has an internal transmission of at least 80%/cm, and more preferably at least 88%/cm at 157 nm.

Figure 2:
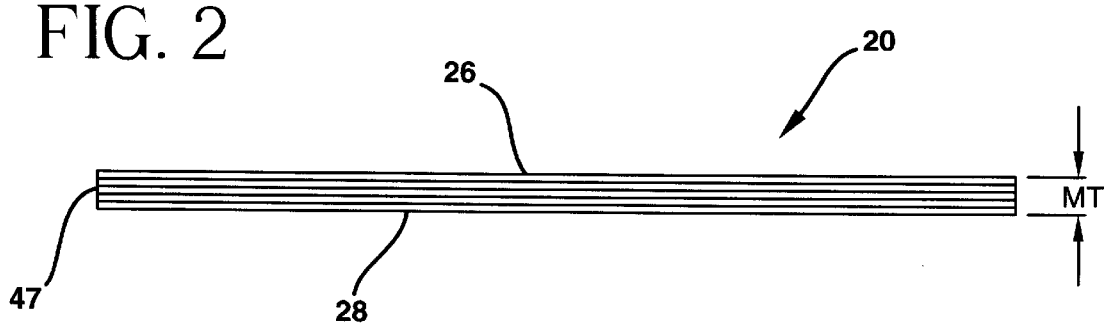
FIG. 2 is a side view of an embodiment of the invention.

The invention includes a glass lithography mask blank preform for forming a lithography mask. As shown in FIGS. 1–3, the preform for a flat planar glass mask member has a top planar surface 26, a bottom planar surface 28. The invention includes preform glass tube 22 for forming into a flat planar glass member having top and bottom planar surfaces and parallel layers of striae. Tube 22 is a preform for forming a mask having a mask width MW, a mask length ML, and a mask thickness MT. Preform glass tube 22 has an inside radius IR, a thickness T, a length L and a longitudinal center tube axis CA. Glass tube 22 includes concentric layers of striae 47 centered about center axis CA, with the inside tube radius IR≧(7/44)MW, thickness T'MT, and length L≧ML. Preferably the glass tube is comprised of a silicon oxyfluoride glass, and most preferably a silicon oxyfluoride glass with an OH content ≦10 ppm. The invention also includes the lithography mask 20 formed from this glass lithography mask preform 22 with mask 20 being a flat planar glass member with top planar surface 26, a bottom planar surface 28, mask width MW, mask length ML, and mask thickness MT. Flat planar glass mask 20 includes parallel layers of striae 47 which are parallel to top planar surface 26 and bottom surface 28.

The invention also includes the method of making mask 20 with the steps of: providing a glass tube mask preform 22 having inside radius IR, thickness T, length L, longitudinal center tube axis CA, and concentric layers of striae 47 centered about center axis CA; and flattening glass tube 22 into a flat planar glass mask having top planar surface 26, bottom planar surface 28, and parallel layers of striae 47 parallel with top planar surface 26 and bottom planar surface 28. The method includes cutting glass tube 22 along length L and in alignment with axis CA to facilitate flattening and polishing top planar surface 26 and bottom surface 28 to provide smooth flat planar mask application surfaces. The method preferably includes flattening tube 22 into flat planar mask 20 so that mask 20 has a mask width MW with $MW \leq (44/7)IR$, a mask thickness MT with MT<T, and a mask length ML with $ML \leq L$. Preferably such a method with $MW \leq (44/7)IR$, includes forming a single longitudinal cut along tube length L in alignment with center axis CA. In a further embodiment the method includes forming two longitudinal cuts along tube length L in alignment with center axis CA and flattening the cut preform into a flat planar mask having a mask width MW with $MW \leq (22/7)IR$, a mask thickness MT with MT<T, and a mask length ML with $ML \leq L$. In a further embodiment the method includes forming three longitudinal cuts along tube length L in alignment with center axis CA and flattening the cut preform into a flat planar mask having a mask width MW with $MW \leq (44/21)IR$, a mask thickness MT with MT<T, and a mask length ML with $ML \leq L$. In a further embodiment the method includes forming four longitudinal cuts along tube length L in alignment with center axis CA and flattening the cut preform into a flat planar mask having a mask width MW with $MW \leq (11/7)IR$, a mask length ML with $ML \leq L$ and a mask thickness MT with MT<T.

In a preferred embodiment of making the mask, flattening includes expanding glass tube 22 into a mold 200 having a flat planar side. Flattening and expanding glass tube 22 preferably includes providing flat planar sided mold 200 with a square cross section, encompassing glass tube 22 with square cross section mold 200, expanding glass tube 22 into square cross section mold 200 wherein expanded flattened glass tube 22F (22 flattened) has a square cross section. The method further includes cutting at least one side from the square cross section expanded flattened glass tube 22F to provide flat planar glass mask blank 20. In FIG. 24, dashed lines indicate preferred cutting areas which provide four flat planar mask blanks 20. In FIG. 24 dashed reference numbers and arrows indicate the orientation of blanks 20 that can be cut from flattened tube 22F.

The invention further includes a glass blank preform. Preferably the glass blank preform is a preform for flat planar glass blanks. Most preferably the glass blank preform is a preform for photolithography masks. Glass blank preform 22F is comprised of a longitudinal glass tube having a longitudinal length, a flat sided polygonal cross sectional shape and a central longitudinal axis along the longitudinal length and normal to the polygonal cross sectional shape, with the glass tube having concentric layers of striae 47 centered about the central axis. Preferably the glass tube is comprised of a silica glass and includes $SiO_2$. In a preferred embodiment the silica glass is a high purity fused silica. More preferably the glass tube is a silicon oxyfluoride glass tube. Preferably the glass tube is substantially free of OH.

Preferably the glass tube is substantially free of Cl. Preferably the glass tube is substantially free of $H_2$. Preferably the polygonal cross sectional shape is rectangular, and most preferably is square.

The invention further includes a method of making a glass blank. Preferably the method is a method of making a flat planar glass blank. Most preferably the method is a method of making a lithography photomask glass blank. The method includes providing a longitudinal glass tube 22, providing a longitudinal tubular mold 200 having a flat sided polygonal interior cross sectional shape, encompassing glass tube 22 with the longitudinal tubular mold polygonal interior cross sectional shape of mold 200, heating glass tube 22, expanding heated glass tube 22 into mold 200 so that expanded glass tube 22 conforms to mold 200, cooling conforming expanded glass tube 22 to provide a flat sided polygonal shaped glass tube 22F, and cutting a flat side from flat sided polygonal shaped glass tube 22F. The method preferably includes cutting glass tube 22F to provide at least one flat planar glass blank, most preferably cutting to provide at least two flat planar glass blanks, and most preferably to provide at least four flat planar glass blanks. The method preferably includes cutting glass tube 22F to provide at least one lithography photomask glass blank, more preferably at least two lithography photomask glass blanks, and most preferably four photomask glass blanks. Preferably providing longitudinal glass tube 22 includes providing a $SiO_2$ soot tube and consolidating the soot tube into a glass. Providing a $SiO_2$ soot tube preferably includes depositing $SiO_2$ soot on a support member. Providing glass tube 22 includes providing a glass tube that contains silicon dioxide, and in a preferred embodiment includes providing a high purity fused silica glass tube. In the most preferred embodiment providing glass tube 22 comprises providing a silicon oxyfluoride glass tube.

The invention further includes a glass blank preform for forming a blank. Preferably the glass blank preform is a preform for forming lithography mask flat planar glass blanks. The flat planar glass blank preform is for forming blanks having a blank width MW, a blank length ML and a blank thickness MT. Preferably MW is a lithography mask blank width, ML is a mask blank length, and MT is a mask blank thickness. The glass blank preform is a flat sided polygonal glass tube 22F with a thickness T, a length L, a flat sided height H, and a longitudinal center tube axis CA. The glass tube 22F includes concentric layers of striae 47 centered about center axis CA and $H \geq MW$, $T \geq MT$, and $L \geq ML$. Preferably glass tube 22F is comprised of silicon dioxide, and more preferably is a high purity fused silica glass. Most preferably glass tube 22F is silicon oxyfluoride glass. Preferably glass tube 22F is a low OH glass, preferably with less than 10 ppm OH, and most preferably no detectable amount of OH. Preferably glass tube 22F is a low chlorine glass, preferably with less than 50 ppm chlorine, and more preferably chlorine free with less than 10 ppm chlorine. Preferably glass tube 22F is a $H_2$ free glass, preferably with less than $1 \times 10^{17}$ $H_2$ molecules/cm$^3$, preferably less than $5 \times 10^{16}$, more preferably less than $3 \times 10^{16}$, with no detectable $H_2$. The invention also includes a lithography mask blank 20 formed from the glass blank preform 22F wherein the mask blank 20 is a flat planar glass member with a top planar surface 26, a bottom planar surface 28, a mask blank width of MW, a mask blank length of ML, and mask blank thickness of MT. Mask blank 20 includes parallel layers of striae 47 which are parallel to top planar surface 26 and bottom planar surface 28.

EXAMPLES

The silicon oxyfluoride glass of the invention preferably has very low levels of OH (<10 ppm wt. OH), very low trace levels of metal contaminants (<1 ppm wt.), low levels of molecular hydrogen ($H_2 < 5 \times 10^{+16}$ molecules/cm$^3$) and low levels of chlorine (Cl<10 ppm), and has a F wt. % content of 0.5–3 wt. %, so the glass is preferably provided by forming a soot tube which is then treated and consolidated to form the silicon oxyfluoride glass tube which is further heated and treated.

The silicon oxyfluoride glass has a beneficial transmission of light in the below 193 nm vacuum ultraviolet lithography region centered around 157 nm.

A small soot tube 32 was formed by laying down soot 40 as shown in FIG. 8, using silicon tetrachloride as the $SiO_2$ feedstock and natural gas as the fuel, on an alumina support member rod having a diameter of about 5 cm. A larger soot tube 32 was formed by similarly laying down soot 40 on a fused silica tube support member having a diameter of about 9 cm. The soot tubes 32 were consolidated in a consolidation furnace 34 such as shown in FIG. 7. The soot tubes were dehydrated in an atmosphere of He and $Cl_2$ at a drying temperature of about 1000° C. The dehydrated soot tubes were then F doped in an atmosphere of He and $CF_4$ at a F doping temperature at about 1225° C. The F doped dehydrated soot tubes were then sintered at a temperature of about 1450° C. to form consolidated glass tubes 22. The consolidated glass tubes were cut to form a single longitudinal cut 24. Two holes were drilled in each of the two ends of tube 22 proximate cut 24. As shown in FIG. 5, platinum wires were attached to one end of the tube 22 through the drilled holes. Platinum wires were used to attach a fused silica weight to the other end of tube 22. The cut tubes were suspended in furnace 30 using suspension hanging system 50. The suspended cut tube was stretched flat by heating the tube in the furnace to a temperature of about 1500° C. The resulting stretched cut tubes were further flattened by sagging in a furnace 30 as shown in FIG. 6. Sagging the cut tube flat was achieved by positioning the stretched tube on a flat inert contaminant free planar support surface and heating the furnace to about 1730° C. The preferred approach for consolidating a soot preform 32 in a silicon oxyfluoride glass includes drying the porous $SiO_2$ soot tube in a $He/Cl_2$ atmosphere between 1000–1100° C. The soot tube 32 is then heated in a helium fluorine doping atmosphere which includes a fluorine containing gas such as $SiF_4$ or $CF_4$ and at a temperature between 1150–1250° C. The amount of fluorine incorporated in the glass ([F]) is controlled by the partial pressure of the fluorine-containing gas (P) and the temperature (T) according to the relationship:

[F]=$C \times e^{-E/RT} \times P^{1/4}$ where C is a constant, R is the Gas Constant, and E is the Activation Energy for the reaction between the fluorine-containing gas and silica. The soot tube is then sintered by passing it through a high temperature zone in the range of 1450–1500° C. in an atmosphere of helium or helium and the fluorine containing gas, with the atmosphere being free of chlorine so that inclusion of chlorine in the glass is inhibited. Such silicon oxyfluoride glasses have provided internal transmittances at 157 nm of about 84%/cm.

Example 1

Figure 14:
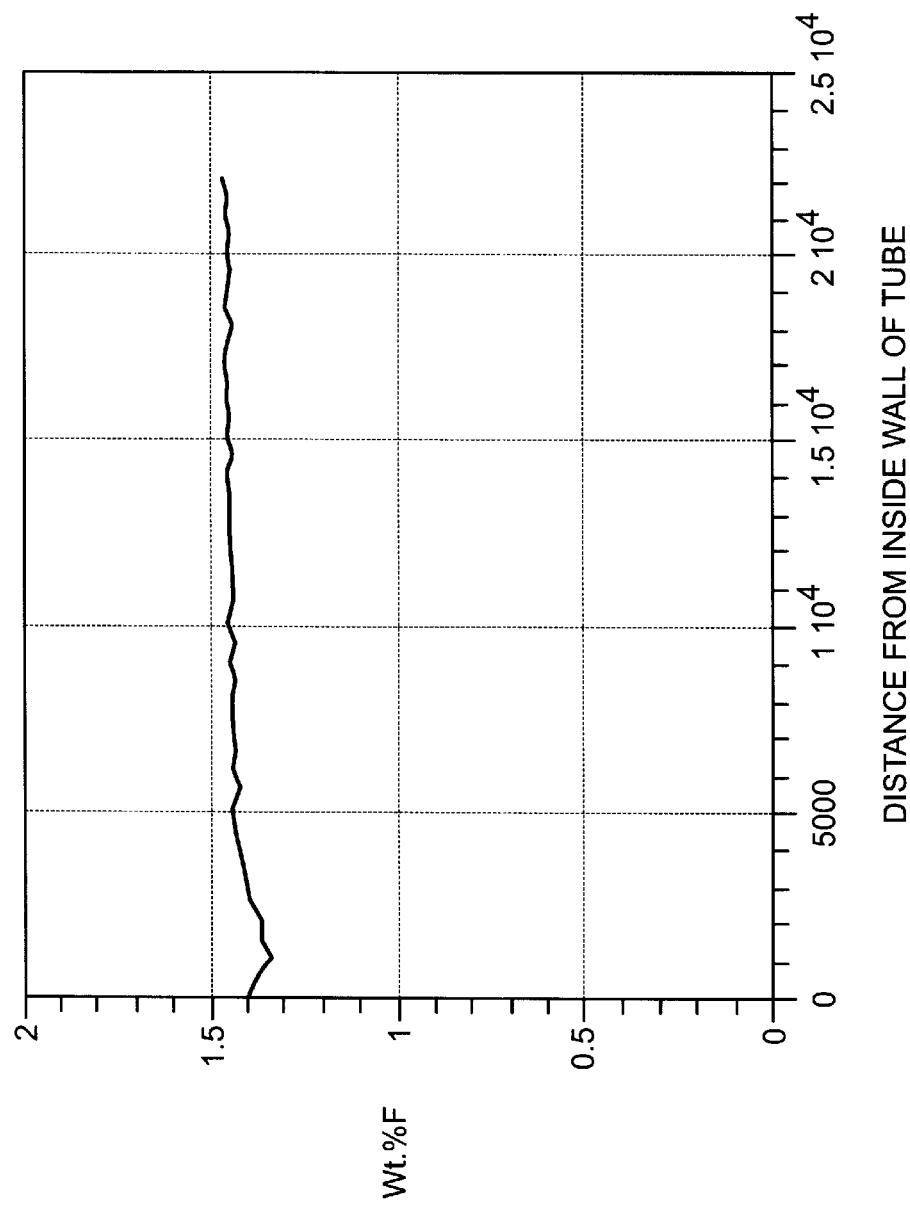
FIG. 14 is a plot of wt. % F (y-axis) vs. distance from inside wall of tube (x-axis) in accordance with the invention.
Figure 15:
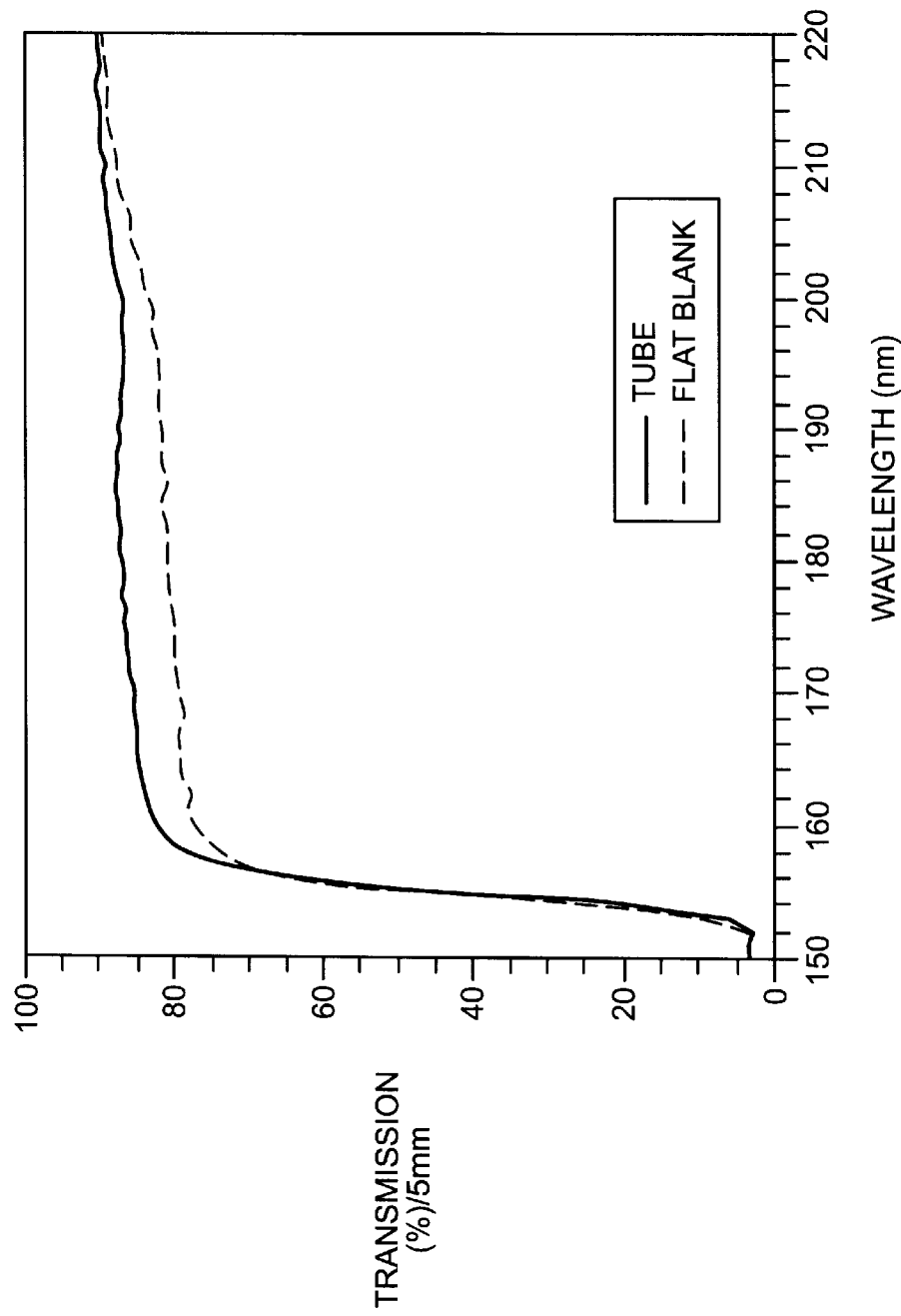
FIG. 15 is a plot of transmission (%)/5 mm (y-axis) vs. wavelength (nm) (x-axis) in accordance with the invention.

A 5009 gram, 87 cm long $SiO_2$ soot preform was made by depositing soot using $SiCl_4$ as the $SiO_2$ feedstock as shown in FIG.8. The soot was deposited on a 47 mm diameter hollow alumina bait rod tube which was removed from the soot preform after deposition. As shown in FIG.7 the soot preform was vertically hung in a furnace for 120 minutes at 1100° C. and dehydrated in a dehydrating atmosphere provided by supplying 0.45 slpm $Cl_2$ and 22 slpm He from the dehydrating treatment gas source. The furnace temperature was then raised to 1175° C. over 30 mins with a treatment atmosphere provided by supplying 2 slpm $_2$ and 20 slpm He. At 1175° C., fluorine was incorporated into the soot preform with a 240 minute exposure with a fluorine doping treatment atmosphere provided by supplying 2 slpm $SiF_4$ and 18 slpm He. The preform was then lowered at a rate of 6 mm/min into the bottom part of the furnace heated at 1480° C. under the same atmosphere to sinter it to a fully dense consolidated silicon oxyfluoride glass. The silicon oxyfluoride glass tube obtained had dimensions of about: 71 mm OD, 25 mm ID, and 25 mm wall thickness and 67 cm length. Microprobe analysis showed the fluorine concentration to be uniform across the thickness of the tube with an average concentration of about 1.45 wt. % F (FIG. 14). The transmission of the glass piece at 157 nm was measured to be 75%/5 mm which includes reflection losses (FIG. 15).

A 13 cm long section of the tube was cut from the silicon oxyfluoride glass mask preform. The tube was core drilled to a 41 mm ID with a wall thickness of 15 mm. The tube was then slit along its length and holes were drilled through the glass along each edge of the slit. Pt wires were threaded through the holes. A silica weight was attached to one set of wires, the other set of wires were attached to a silica rod which acted as the hanging mechanism, the tube was then lowered into a glass manipulation furnace in an air atmosphere at 1500° C. for 30 minutes as shown in FIG. 5. Upon removal, the tube was found to be opened into a plate which had a slightly curved shape.

A section was cut from this plate. The piece was cleaned in solvents (acetone and isopropanol) then in a 5%HF/5%$HNO_3$ bath to remove any surface contaminants that may have been present. The piece was placed on a flat planar high purity graphite substrate in a glass manipulation furnace and heated for 1 hour under a He furnace atmosphere at 1710° C. as shown if FIG. 6. Upon removal, the piece was completely flat and clear and had not flowed out. The transmission of this fully processed glass was 72%/5 mm at 157 nm which includes reflection losses (FIG. 15).

Example 2

Figure 16:
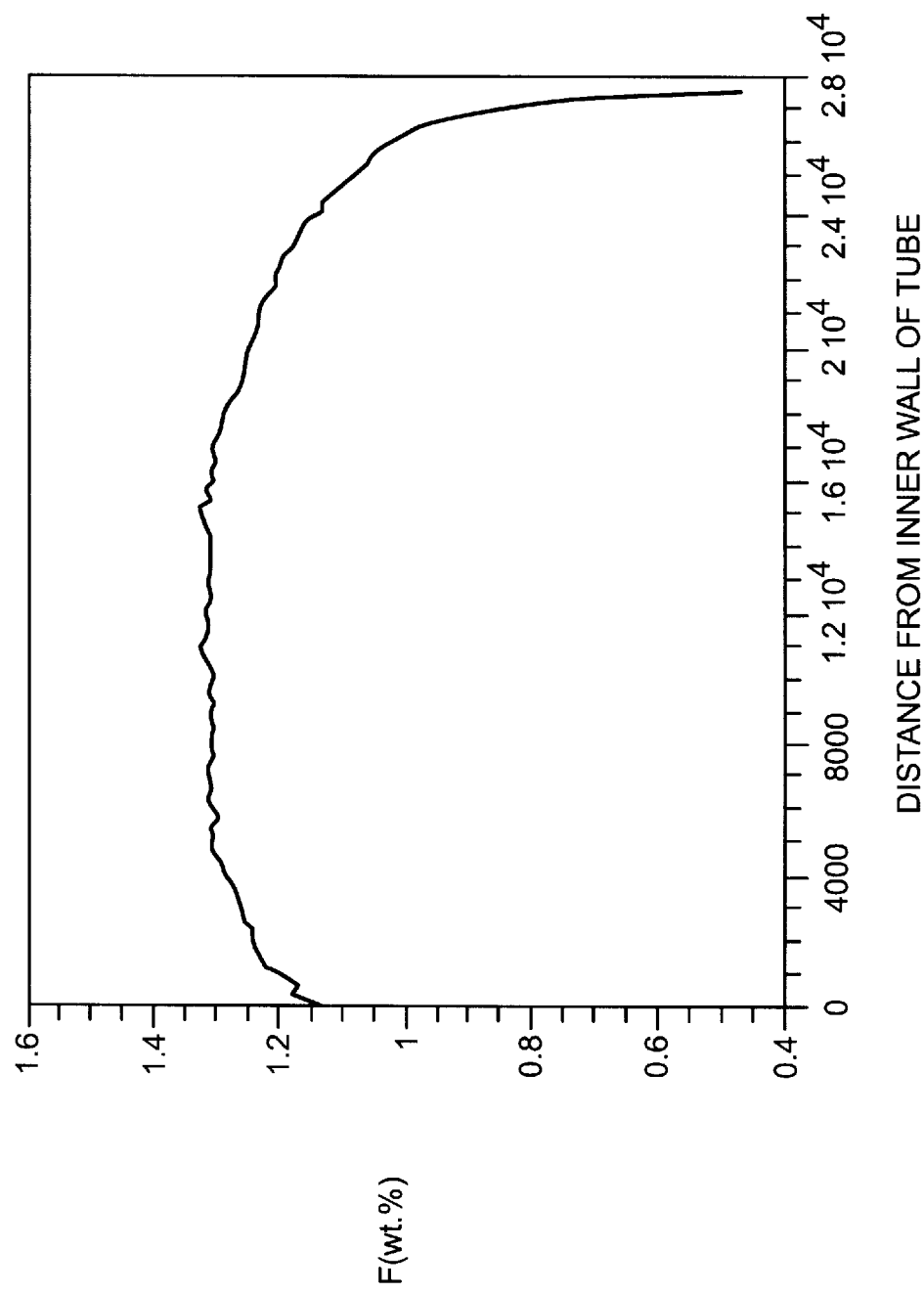
FIG. 16 is a plot of wt. % F (y-axis) vs. distance from inside wall of tube (x-axis) in accordance with the invention.

A 5600 gram, 87 cm long $SiO_2$ soot preform was made by depositing soot using $SiCl_4$ as the $SiO_2$ feedstock. The soot was deposited on a 47 mm diameter hollow alumina bait rod which was removed from the soot preform after deposition. The soot preform was hung in a furnace at 1100° C. and dehydrated in a dehydrating treatment atmosphere provided by supplying 0.51 slpm $Cl_2$ and 20.6 slpm He for 130 minutes. The furnace temperature was then raised to 1175° C. over 30 mins with an atmosphere of 20.6 slpm He. At 1175° C., the soot preform was exposed to an atmosphere of 3 slpm $CF_4$ and 17 slpm He for 240 minutes. The preform was then lowered at a rate of 6 mm/min into the bottom part of the furnace at 1480° C. under the same atmosphere to sinter it to a fully dense consolidated silicon oxyfluoride glass. The silicon oxyfluoride glass tube obtained had dimensions of about 81 mm OD, 25 mm ID, and 28 mm wall thickness and 67 cm length. Microprobe analysis showed the fluorine concentration to be slightly less uniform across the entire thickness of the tube than Example 1, but still relatively uniform across the middle of the tube wall (FIG. 16). The average concentration was about 1.24 wt. % F.

A 13 cm long section of tube was cut from this silicon oxyfluoride glass preform. The tube was core drilled to a 51 mm ID with a 15 mm wall thickness. The tube was then slit along its length and holes were drilled through the glass along each edge of the slit. Pt wires were threaded through the holes. A silica weight was attached to one set of wires. The other set was attached to a silica rod which acted as the hanging mechanism. The tube was lowered into a furnace at 1500° C. in an air atmosphere for 30 minutes. Upon removal, the tube was found to be opened into a plate which had a slightly curved shape.

The Pt wires were removed. The plate was cleaned and the entire plate was placed on a high purity graphite substrate and heated to 1710° C. in He for 1 hour. Upon removal, the plate was observed to be completely flat and clear. A 15.2 cm×12.7 cm plate was cut from this flattened tube and optically polished to a 0.635 cm thickness. The birefringence was measured across this plate and found to range from +2.5 nm/cm to −2.5 nm/cm at 633 nm. The plate was annealed and remeasured for birefringence. The annealing schedule for the 6"×5" plate was:

heat 30° C./min to 825° C. (annealing point of the glass viscosity =10 13.2 poise)

hold 825° C. for two (2) hours cool at 20° C./hour (0.330 C./min) to 625° C., and cool furnace rate to room temperature.

The birefringence of the 6"×5" plate was within ±2.5 nm/cm across the middle 5"×4" of the plate and within ±1 nm/cm across the middle 4"×3" of the plate.

Example 3

Figure 17:
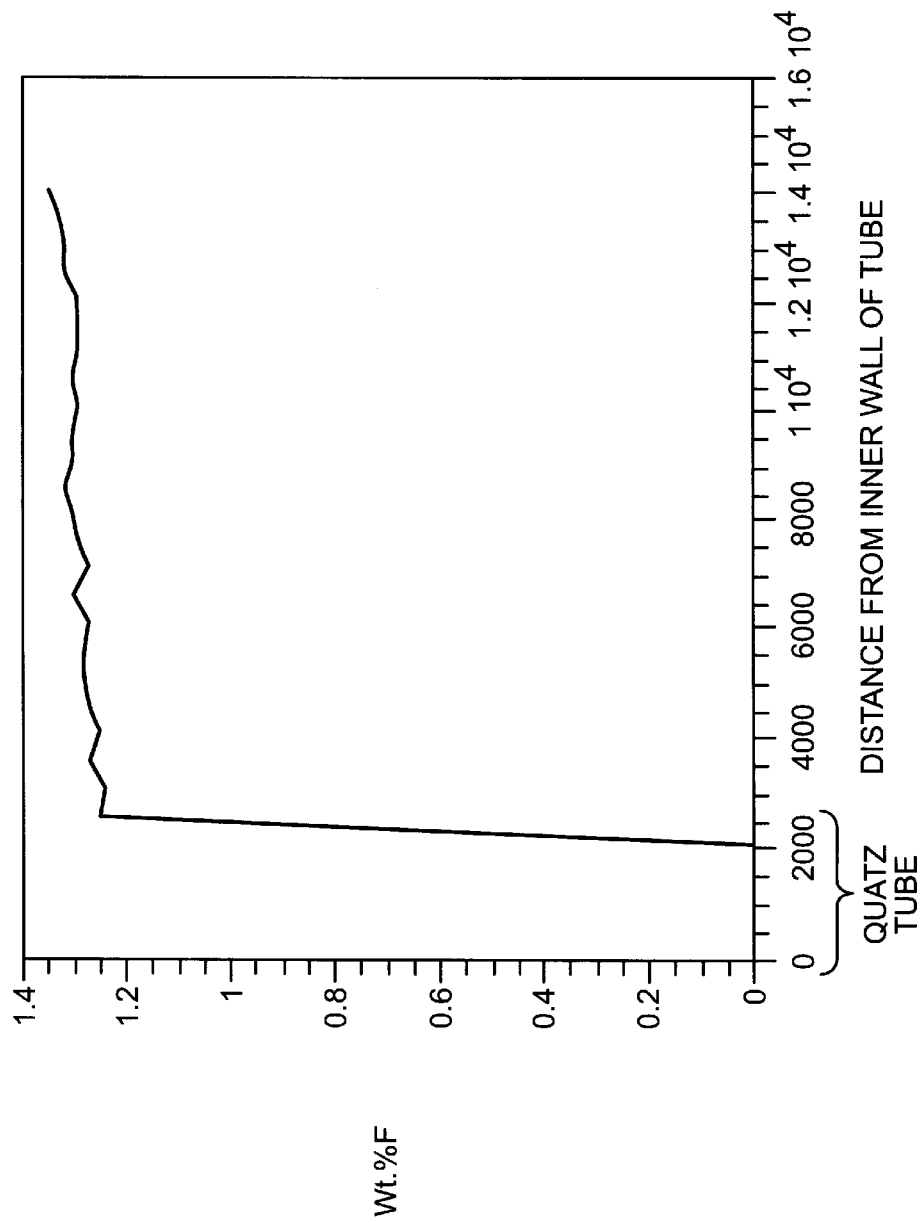
FIG. 17 is a plot of wt. % F (y-axis) vs. distance from inside wall of tube (x-axis) in accordance with the invention.
Figure 18:
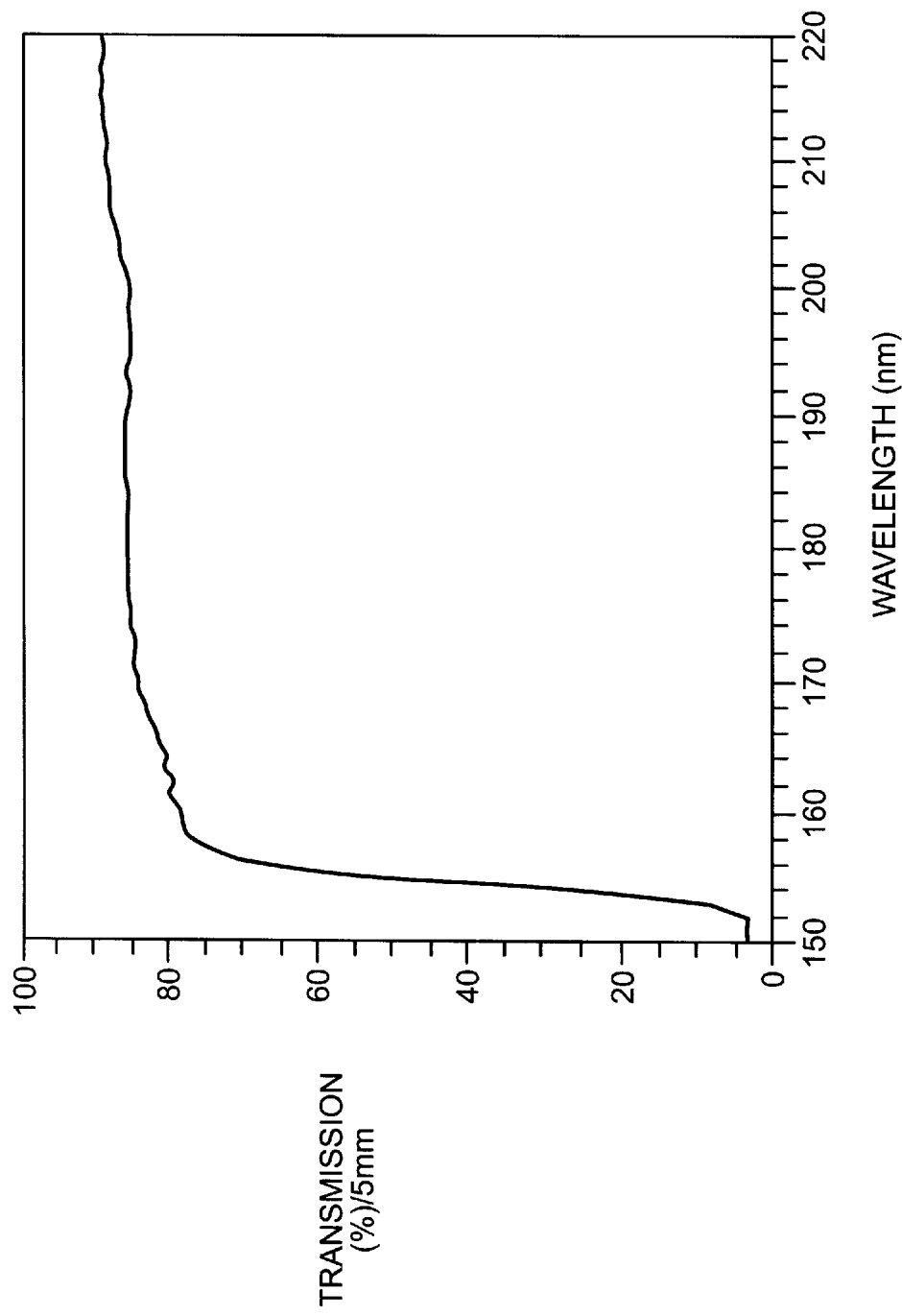
FIG. 18 is a plot of transmission (%)/5 mm (y-axis) vs. wavelength (nm) (x-axis) in accordance with the invention.

A 3129 gram, 50 cm long $SiO_2$ soot preform was made by depositing soot using $SiCl_4$ as the $SiO_2$ feedstock. The soot was deposited on a 55 mm OD/50 mm ID silica tube obtained from Quartz Scientific with a quartz handle flameworked to one end. The Quartz Scientific, Inc. (Fairport Harbor, Ohio 44077) silica tube was a part number QT50DD 55 mm OD×50 mm ID bait tube which was fused quartz silica glass tube made by melting high purity quartz silica glass crystals with a purity of 99.995%. The soot preform on the fused quartz bait tube was hung in a furnace at 1100° C. and dehydrated in an atmosphere provided by supplying 0.4 slpm $Cl_2$ and 40 slpm He for 120 minutes. The furnace temperature was then raised to 1200° C. over 30 mins with an atmosphere of 2 slpm $O_2$ and 20 slpm He. At 1200° C., the soot preform was exposed to a fluorine doping atmosphere of 1.2 slpm $SiF_4$, 18.8 slpm He, and 0.2 slpm $_2$ for 180 minutes. The preform was then lowered at a rate of 5 mm/min into the bottom part of the furnace at 1480° C. under the same atmosphere to sinter it to a fully dense consolidated silicon oxyfluoride glass. The silicon oxyfluoride glass tube obtained had a 81 mm OD , a 49 mm ID, and a 16 mm wall thickness (including the quartz bait tube) and was 40 cm long. Microprobe analysis showed the fluorine concentration to be uniform across the thickness of the tube with an average concentration of 1.29 wt. % F (FIG. 17). The transmission of the glass at 157 nm was measured to be 75%/5 mm which includes reflection losses (FIG. 18).

Example 4

Figure 19:
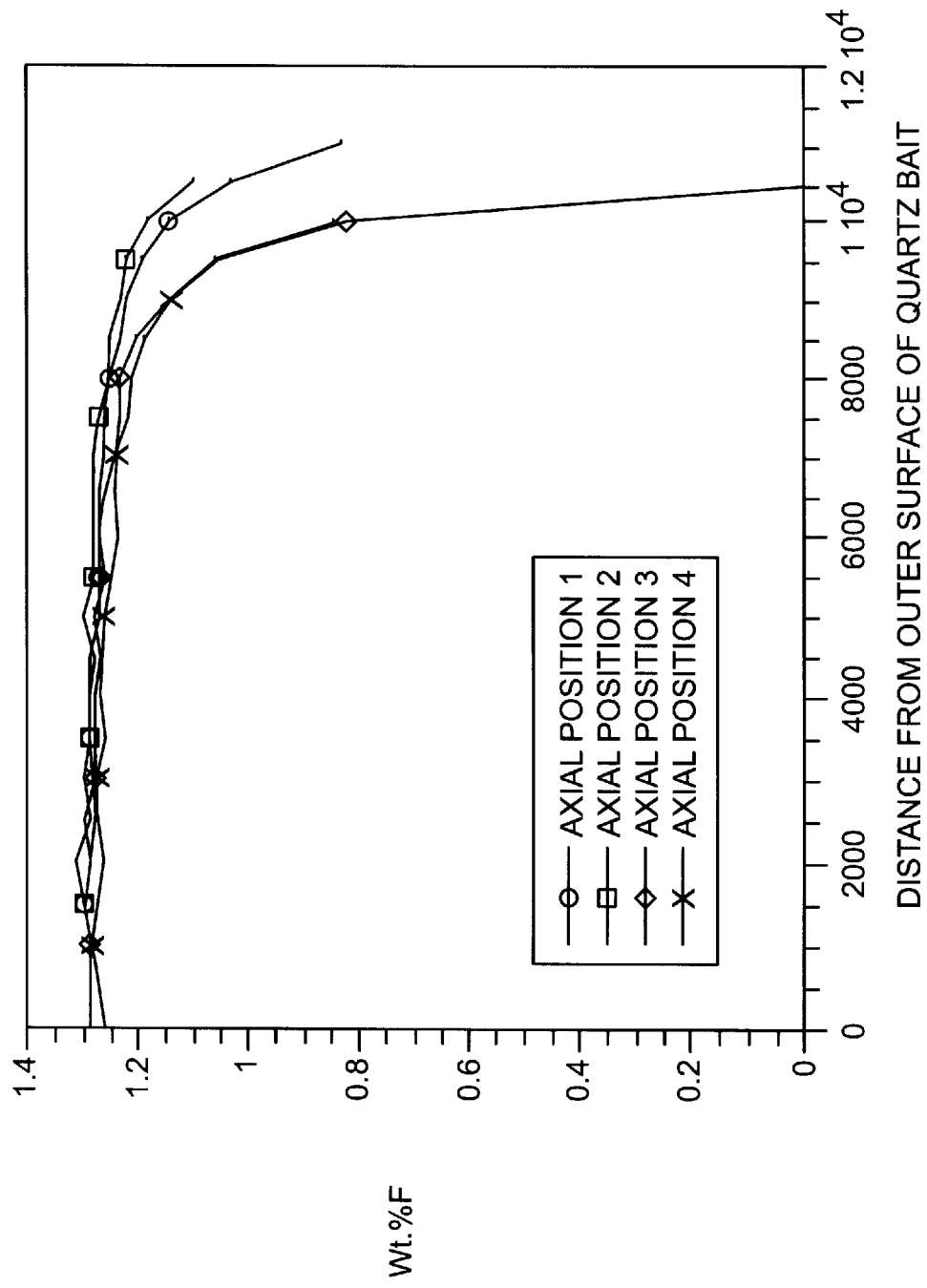
FIG. 19 is a plot of wt. % F (y-axis) vs. distance from Outer Surface of Quartz Bait (x-axis) in accordance with the invention.

A 2400 gram, 50 cm long $SiO_2$ soot preform was made by depositing soot using $SiCl_4$ as the $SiO_2$ feedstock. The soot was deposited on a 55 mm OD/50 mm ID silica tube obtained from Quartz Scientific with a quartz handle flameworked to one end (same as EXAMPLE 3). The soot preform on the quartz bait tube was hung in a furnace at 1000° C. and dehydrated in a treatment atmosphere provided by supplying 0.4 slpm $Cl_2$ and 40 slpm He for 120 minutes. The furnace temperature was then raised to 1200° C. over 30 mins with an atmosphere of 2 slpm $O_2$ and 20 slpm He. At 1200° C., the soot preform was exposed to an atmosphere of 1.5 slpm $CF_4$ and 18.5 slpm He for 180 minutes. The preform was then lowered at a rate of 5 mm/min into the bottom part of the furnace at a sintering temperature of 1480° C. under the same atmosphere to sinter it to a fully dense consolidated silicon oxyfluoride glass. The silicon oxyfluoride glass tube obtained had dimensions of about 76 mm OD, 50 mm ID, 13 mm wall thickness (including the quartz bait tube) and 38 cm length. Microprobe analysis showed the fluorine concentration to be slightly less uniform across the entire thickness of the tube than Example 3, but still relatively uniform across the middle of the tube wall. Measurements made at four equally spaced locations along the length of the tube show the axial uniformity of the F concentration (FIG. 19). The average concentration was about 1.26 wt. % F.

A 7.5 cm long section of tube was cut from this silicon oxyfluoride glass preform. The tube was core drilled to a 56 mm ID with a 10 mm wall thickness. The tube was then slit along its length and holes were drilled through the glass along each edge of the slit. Pt wires were threaded through the holes. A silica weight was attached to one set of wires. The other set was attached to a silica rod which acted as the hanging mechanism. The tube was lowered into a furnace at 1500° C. for 30 minutes. Upon removal, the tube was found to be opened into a plate which had a slightly curved shape.

A 6.3×7.6 cm section was cut from this plate. The piece was placed on a Pt-Rh foil and loaded into a furnace (air atmosphere) at 1400° C. The furnace temperature was increased to 1550° C. over 15 minutes. The sample was held at 1550° C. for 30 minutes then removed from furnace and quickly pressed flat using a hand held (manual) stainless steel weight with the pressing surface covered with clean Pt foil. The sample cooled to room temperature without breakage.

Example 5

A 547 gram/70 cm long $SiO_2$ soot preform was made by depositing soot using $SiCl_4$ as the $SiO_2$ feedstock. The soot was deposited on a 6.35 mm diameter solid alumina bait rod which was removed after deposition. The soot preform was dehydrated in a furnace at 1100° C. in a dehydrating atmosphere provided by supplying 0.066 slpm $Cl_2$ and 40.64 slpm He for 60 minutes. The atmosphere was then changed by supplying only 40 slpm He and the furnace temperature was ramped to 1225° C. over 45 minutes with 40 slpm He. At 1200° C., the soot preform was exposed to a fluorine doping atmosphere of 0.8 slpm $CF_4$ and 39.2 slpm He for 120 minutes. The preform was then lowered at a rate of 5 mm/min into the bottom part of the furnace (downfed into sinter zone at 5 mm/min) heated at 1480° C. under the same atmosphere (0.8 slpm $CF_4$ and 39.2 slpm He) to sinter it to a fully dense consolidated silicon oxyfluoride glass. The silicon oxyfluoride glass tube obtained had dimensions of about 28 mm OD, 6 mm ID, and 11 mm wall thickness and 50 cm length.

A high purity graphite square cross section tubular expansion mold 200 high purity graphite slabs with (<2 ppm impurities) was constructed and obtained. The flat sided mold had a square cross section with inner square flat sided polygon dimensions of 31 mm×31 mm, outer dimensions of 41 mm×41 mm and was 60 cm long. Such a mold 200 can be provided by assembling four longitudinal rectangular graphite slabs as shown in FIG. 20.

The tip of the silicon oxyfluoride glass tube was flameworked sealed shut and this closed end silicon oxyfluoride glass tube was inserted into the provided high purity graphite square cross section tubular mold which completely surrounded the closed end silicon oxyfluoride glass tube. The whole assembly was placed at the top of a He-purged vertical tube furnace and positioned so that only the bottom of the silicon oxyfluoride glass tube (closed end) was in the hot zone. The hot zone was approximately 5 cm long. The center of the closed end silicon oxyfluoride tube was pressurized to 5 psig with He. The furnace temperature was raised to 1550° C. After ten minutes, no change was observed so the temperature was raised to 1600° C. After an additional ten minutes, still no change in the tube shape was observed. The furnace temperature was increased to 1650° C. After about 2 minutes at 1650° C. and 5 psig centerline pressure the closed end silicon oxyfluoride glass tube had blown out and expanded to completely fill the mold and come into contact with the interior square tube walls at the end of the mold. While maintaining the expanding pressure the whole assembly (silicon oxyfluoride glass tube and mold) were then passed through the hot zone at a rate of 3 mm/min until the entire tube was blown out. The silicon oxyfluoride glass tube was cooled in the mold. The glass tube did not stick to the mold and was easily removed. The square flat sided polygon silicon oxyfluoride glass tube glass obtained had outer dimensions of 31 mm×31 mm and inner dimensions of 21 mm×21 mm. Each side of this tube could be sliced off and polished to make a flat plate with the striae oriented parallel to the face of the plate. The average fluorine concentration of the glass measured by microprobe was 0.77 wt. %. Silica soot was doped with fluorine during formation and deposition. In addition to delivering $SiCl_4$ to the center forms tube of the combustion burner, fluorine doping source feedstock molecules were delivered to the combustion burner, fluorine doping source feedstock molecules were delivered to the combustion burner in order to form fluorine doped silica. Utilizing soot producing burners such as described in U.S. Pat. No. 5,599,371 (Cain et al., Feb. 4, 1997) silica soot doped with fluorine and silicon oxyfluoride glass were formed. Silica soot with 3.5 wt. % F was produced by flowing 1.5 liter/m of $_2$ and 1.5 liter/m of $CH_4$ to the flame premix to provide a soft flame. 1 liter/m of $SiCl_4$ and 1 liter/m $CF_4$ and 2000 cc/m of carrier $O_2$ was delivered to the fume tube. Additionally 1 liter/m of $SF_6$ was delivered to the innershield to improve F doping. The same delivery rates were used except 10 liter/m $O_2$ and 10 liter/m methane was delivered to the flame premix to provide a stranger flame, with the soot deposited as soot preform which was dried with chlorine the consolidated into a glass with 1 wt. % F. Improved silicon oxyfluoride glass may be provided by drying with fluorine and using fluorine treatment gases through consolidation to maintain F levels and avoid Cl contamination. Cl contamintion is preferably inhibited by sufficient non-chlorine gas treatment exposures prior to consolidation.

The preferred means of finishing the glass into a flat planar photomask blank with a surface roughness ≦0.15 nm rms is chemical mechanical finishing and polishing of the glass. The chemical mechanical finishing of the glass preferably includes polishing the surface of the glass to a surface roughness Ra ranging form 6 to 10 angstroms. This is preferably achieved by polishing with an aqueous solution of at least one metal oxide abrasive. The metal oxide abrasives can be chosen from alumina, titania, zirconia, germania, silica, and ceria, with the preferred metal oxide abrasive being cerium oxide. The surface is then further polished with an alkali aqueous solution of colloidal silica to a surface roughness Ra of 5 angstroms or less. The alkali solution of colloidal silica is buffered to a pH range of 8 to 12, preferably 10 to 12, and the colloidal silica particles have an average particle size less than or equal to 50 nm. The preferred surface roughness ≦0.15 nm rms is preferably achieved with a first polishing step of cerium oxide with a hard polishing pad (preferably blown polyurethane), second polishing step of cerium oxide with a soft polishing pad (preferably napped polyurethane) and a third step of colloidal silica with a soft pad (preferably napped polyurethane). Reference is made and incorporated thereof to U.S. patent application No. 09/364,143 filed on Jul. 30, 1999 in regards to chemical mechanical polishing steps and incorporated herein.

As shown in FIG. 27, photomask blank 20 is utilized in a VUV wavelength projection lithography system 327. The invention includes forming a lithographic image pattern 300 on the photomask blank planar surface, preferably to result in a 157 nm VUV wavelength lithography patterned transmission photomask preferably utilizing a deposited Cr layer on the glass blank. The invention includes impinging VUV light including the 157 nm wavelength on the photomask planar surface to form a projection image pattern and projecting the projection image pattern onto a radiation sensitive material 330. The VUV illumination system emits VUV light below 193 nm, preferably below 165 nm and in the 157 nm region such as emitted by a $F_2$ excimer laser.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. A method of making a lithography photomask blank, comprising the steps of:

providing a silicon oxyfluoride glass tube having an OH content less than 50 ppm, cutting said silicon oxyfluoride glass tube, flattening the silicon oxyfluoride glass tube, and forming said flattened cut silicon oxyfluoride glass tube into a photomask blank having a planar surface.

2. A method as claimed in claim 1, wherein providing a silicon oxyfluoride glass tube further includes providing a silicon oxyfluoride glass tube with a fluorine concentration greater than about 0.5 wt. %.

3. A method as claimed in claim 1, wherein providing a silicon oxyfluoride glass tube further includes providing a silicon oxyfluoride glass tube with a fluorine concentration in the range from about 0.5 wt. % to about 2.5 wt. %.

4. A method as claimed in claim 1, wherein providing a silicon oxyfluoride glass tube further includes providing a silicon oxyfluoride glass tube with an OH content less than 5 ppm.

5. A method as claimed in claim 1, wherein providing a silicon oxyfluoride glass tube further includes providing a silicon oxyfluoride glass tube with an OH content less than 1 ppm.

6. A method as claimed in claim 1, wherein providing a silicon oxyfluoride glass tube further includes providing a $SiO_2$ soot tube, dehydrating the $SiO_2$ soot tube to remove OH from the $SiO_2$ soot, replacing a plurality of silicon to oxygen bonds with a plurality of silicon to fluorine bonds and consolidating the soot tube into a glass.

7. A method as claimed in claim 1, further including depositing SiO$_2$ soot on a circular cross section support member.

8. A method as claimed in claim 7, further comprising removing OH from said SiO$_2$ soot and incorporating fluorine into said SiO$_2$ soot.

9. A method as claimed in claim 8 wherein removing OH from said SiO$_2$ soot includes heating said SiO$_2$ soot in a dehydrating atmosphere.

10. A method as claimed in claim 9, wherein said dehydrating atmosphere includes chlorine.

11. A method as claimed in claim 9, wherein said dehydrating atmosphere includes helium.

12. A method as claimed in claim 9, wherein said dehydrating atmosphere includes fluorine.

13. A method as claimed in claim 8 wherein incorporating fluorine into said SiO$_2$, soot comprises exposing said SiO$_2$ soot to an atmosphere containing fluorine.

14. A method as claimed in claim 13 wherein said atmosphere containing fluorine includes SiF$_4$.

15. A method as claimed in claim 13 wherein said atmosphere containing fluorine includes CF$_4$.

16. A method as claimed in claim 13 wherein said atmosphere containing helium.

17. A method as claimed in claim 8 wherein OH is first removed from the SiO$_2$ soot and then fluorine is incorporated.

18. A method as claimed in claim 1 wherein providing a silicon oxyfluoride glass tube further comprises providing a glass tube that consists essentially of Si, O, and F.

19. A method as claimed in claim 18 wherein said glass tube has a F wt. % concentration ranging from 0.5 to 3 wt. % and has an OH content less than 10 ppm.

20. A method as claimed in claim 18 wherein removing OH from said SiO$_2$ soot includes heating said soot to a temperature in the range from 900 to 1100° C. in an atmosphere containing Cl, incorporating fluorine into said SiO$_2$ soot includes heating said soot to a temperature in the range from 1125 to 1325° C. in an atmosphere containing F, and then sintering said soot at a temperature in the range from 1350 to 1550° C. into said SiO$_2$ soot and consolidated into a glass so that said glass contains at least 0.5 wt. % F.

21. A method as claimed in claim 1, wherein said silicon oxyfluoride glass tube has a longitudinal length and cutting said tube includes cutting said tube along said longitudinal length.

22. A method as claimed in claim 1 wherein flattening the silicon oxyfluoride glass tube includes heating said tube and applying a deforming force to said heated tube.

23. A method as claimed in claim 22 wherein applying a deforming force to said heated tube further comprises evacuating the heated tube to collapse said heated tube.

24. A method as claimed in claim 22 further comprising, providing a flat sided mold, positioning said flat sided mold proximate said glass tube, applying a deforming fluid pressure force to the heated tube wherein said heated tube conforms to said flat sided mold.

25. A method as claimed in claim 22 further comprising, further comprising, encompassing a mold with said tube and applying a collapsing fluid pressure deforming force to the heated tube wherein said tube collapses against said mold.

26. A method as claimed in claim 22 further comprising: encompassing the silicon oxyfluoride tube with a mold and applying an expanding fluid pressure deforming force to the heated tube wherein said heated tube expands into said mold.

27. A method as claimed in claim 26 wherein encompassing the tube with the mold further includes encompassing the tube with a flat sided mold.

28. A method as claimed in claim 22 further comprising hanging the tube in a furnace heated to a temperature of at least 1480° C.

29. A method as claimed in claim 22 further comprising sagging said tube in a furnace heated to a temperature centered about 1730° C. so that said tube is flattened and flowout of said silicon oxyfluoride glass is substantially inhibited.

30. A method as claimed in claim 21, wherein the tube is cut into at least two separate pieces.

31. A method as claimed in claim 1 wherein providing a silicon oxyfluoride glass tube includes providing a tube that has an inside radius of at least 2.5 cm, a thickness of at least 0.6 cm, and a length of at least 15 cm.

32. A method as claimed in claim 1 wherein providing a silicon oxyfluoride glass tube includes providing a tube that has an inside radius of at least 3.6 cm, a thickness of at least 0.6 cm, and a length of at least 22 cm.

33. A method as claimed in claim 30, wherein providing a silicon oxyfluoride glass tube includes providing a tube that has an inside radius of at least 5 cm, a thickness of at least 0.6 cm, and a length of at least 15 cm.

34. A method as claimed in claim 30, wherein providing a silicon oxyfluoride glass tube includes providing a tube that has an inside radius of at least 7.6 cm, a thickness of at least 0.6 cm, and a length of at least 22 cm.

35. A method as claimed in claim 1, wherein providing a silicon oxyfluoride glass tube includes providing a silicon oxyfluoride glass tube that has concentric layers of striae and the method further includes maintaining the relative orientation of said layers of striae so that said layers of striae are parallel to said photomask blank planar surface.

36. A method as claimed in claim 1, wherein forming into a photomask blank includes polishing said flattened cut silicon oxyfluoride glass tube.

37. A method as claimed in claim 1, further comprising transmitting 157 nm wavelength light through said formed photomask blank.

38. A method as claimed in claim 1, further comprising forming a lithographic image pattern on said photomask blank planar surface.

39. A method as claimed in claim 38 further comprising impinging light including the 157 nm wavelength towards said photomask blank planar surface to form a projection image pattern and projecting the projection image pattern onto a radiation sensitive material.

40. A lithography photomask blank comprising a flat planar silicon oxyfluoride glass member having a top planar surface and a bottom planar surface, said planar silicon oxyfluoride glass member having an OH content ≦10 ppm, a F wt. % concentration ≧0.5 wt. %, said silicon oxyfluoride glass having less than $1 \times 10^{17}$ H$_2$ molecules/cm$^3$ and parallel layers of striae wherein said parallel layers of striae are parallel to said top planar surface.

41. A litography photomask blank as claimed in claim 40, wherein said top planar surface has a surface roughness ≦0.15 nm rms.

42. A lithography photomask blank as claimed in claim 40, wherein said planar silicon oxyfluoride glass member has a 157 nm light transmission percentage of at least 70% per 5 mm thickness of glass.

43. A lithography photomask blank as claimed in claim 40 wherein said silicon oxyfluoride glass consists essentially of Si, O, and F.

44. A lithography photomask blank as claimed in claim 40 wherein said silicon oxyfluoride glass has a F wt. % content in the range from 0.5 wt. % to 3 wt. %.

45. A lithography photomask blank as claimed in claim 40 wherein said flat planar silicon oxyfluoride glass member has a transmission homogeneity at 157 nm in a range from −2% to +2%.

46. A lithography photomask blank as claimed in claim 40 wherein said flat planar silicon oxyfluoride glass member is free of inclusions having a dimension >1 μm.

47. A lithography photomask blank as claimed in claim 40 wherein said flat planar silicon oxyfluoride glass member has a birefringence ≦5 nm/cm.

48. A lithography photomask blank as claimed in claim 40 wherein said flat planar silicon oxyfluoride glass member has a thickness of at least 0.6 cm, a length of at least 15 cm, is free of inclusions having a dimension ≧1 μm, a transmission homogeneity at 157 nm in the range from −2% to +2%, transmission at 157 nm ≧70%, and a birefringence ≦5 nm /cm.

49. A method of making a mask comprising the steps of:
providing a glass tube mask preform having an inside radius IR, a thickness T, a length L, a longitudinal center tube axis CA, and said glass tube mask preform includes concentric layers of striae centered about said center axis CA, flattening said glass tube mask preform into a flat planar glass mask having a top planar surface and a bottom planar surface, wherein said flat planar glass mask has parallel layers of striae that are parallel to said top planar surface and said bottom planar surface.

50. A method as claimed in claim 49, wherein flattening includes cutting said glass tube mask preform along said length L and in alignment with said axis CA and polishing said top planar surface and said bottom planar surface.

51. A method as claimed in claim 49, wherein flattening includes flattening said glass tube mask preform into said flat planar mask with said flat planar mask having a mask width MW, a mask length ML, and a mask thickness MT, wherein MW≦(44/7)IR, MT<T, and ML≦L.

52. A method as claimed in claim 49 wherein flattening includes flattening said glass tube mask preform into said flat planar mask with said flat planar mask having a mask width MW, a mask length ML, and a mask thickness MT, wherein MW≦(22/7)IR, MT<T, and ML≦L.

53. A method as claimed in claim 49 wherein flattening includes flattening said glass tube mask preform into said flat planar mask with said flat planar mask having a mask width MW, a mask length ML, and a mask thickness MT, wherein MW≦(44/21IR, MT<T, and ML≦L.

54. A method as claimed in claim 49 wherein flattening includes flattening said glass tube mask perform into said flat planar mask with said flat planar mask having a mask width MW, a mask length ML, and a mask thickness MT, wherein MW≦(11/7)IR, MT<T, and ML≦L.

55. A method as claimed in claim 49 wherein flattening includes deforming said glass tube against a mold having a flat planar side.

56. A method as claimed in claim 49 further comprising providing said flat planar sided mold with a square cross section, encompassing said glass tube with said square cross section mold, expanding said glass tube into said square cross section mold wherein said expanded glass tube has a square cross section, cutting at least one side from said square cross section expanded glass tube to provide said flat planar glass mask.

57. A method as claimed in claim 49 further comprising encompassing said flat planar sided mold with said glass tube, collapsing said glass tube onto said flat planar side wherein said collapsed glass tube has a flat planar side, cutting said flat planar sided collapsed glass tube to provide said flat planar glass mask.

58. A method as claimed in claim 49 wherein flattening includes heating said glass tube, and evacuating and collapsing said heated glass tube.

59. A method of making a photomask blank, said method comprises:
providing a silicon oxyfluoride glass tube;
heating said glass tube;
evacuating said heated glass tube to collapse said glass tube into a flattened collapsed tube;
forming said flattened collapsed tube into a photomask blank.

* * * * *